United States Patent
Shioga et al.

(10) Patent No.: US 6,873,038 B2
(45) Date of Patent: Mar. 29, 2005

(54) CAPACITOR AND SEMICONDUCTOR DEVICE AND METHOD FOR FABRICATING THE SEMICONDUCTOR DEVICE

(75) Inventors: Takeshi Shioga, Kawasaki (JP);
Kazuaki Karasawa, Kawasaki (JP);
Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/629,761

(22) Filed: Jul. 30, 2003

(65) Prior Publication Data
US 2004/0018693 A1 Jan. 29, 2004

Related U.S. Application Data

(62) Division of application No. 09/956,944, filed on Sep. 21, 2001, now Pat. No. 6,624,501.

(30) Foreign Application Priority Data

Jan. 26, 2001 (JP) .......................................... 2001-18132
Mar. 30, 2001 (JP) ........................................ 2001-100184

(51) Int. Cl.[7] ............................................. H01L 21/44
(52) U.S. Cl. ..................................... 257/686; 257/707
(58) Field of Search ................................. 257/678–796

(56) References Cited

U.S. PATENT DOCUMENTS

| 5,789,303 A | 8/1998 | Leung et al. |
| 5,822,175 A | 10/1998 | Azuma |
| 5,929,473 A | 7/1999 | Nishihori et al. |
| 5,986,301 A | 11/1999 | Fukushima et al. |
| 6,027,947 A | 2/2000 | Evans et al. |
| 6,072,689 A | 6/2000 | Kirlin |
| 6,117,689 A | 9/2000 | Summerfelt |
| 6,147,374 A | 11/2000 | Tanaka et al. |
| 6,160,270 A | 12/2000 | Holmberg et al. |
| 6,180,971 B1 | 1/2001 | Maejima |
| 6,225,185 B1 | 5/2001 | Yamazaki et al. |
| 6,291,272 B1 | 9/2001 | Giri et al. |
| 6,320,213 B1 | 11/2001 | Kirlin et al. |
| 2001/0001292 A1 * | 5/2001 | Bertin et al. ................ 438/107 |

FOREIGN PATENT DOCUMENTS

| JP | Hei 05-102389 A | 4/1993 |
| JP | Hei 09-064236 A | 3/1997 |
| JP | Hei 09-223861 A | 8/1997 |

* cited by examiner

*Primary Examiner*—H. Jey Tsai
(74) *Attorney, Agent, or Firm*—Staas & Halsey LLP

(57) ABSTRACT

A capacitor comprises a first conducting film 12 formed on a substrate 10, a first dielectric film 14 formed on the first conducting film, a second conducting film 18 formed on the first dielectric film, a second dielectric film 22 formed above the second conducting film, covering the edge of the second conducting film, a third conducting film 34 formed above the second dielectric film, covering a part of the second dielectric film covering the edge of the second conducting film. The capacitor further comprises an insulation film 28 covering the edge of the second conducing film or the part of the second dielectric film. An effective thickness of the insulation film between the second conducting film and the third conducing film in the region near the edge of the second conducting film can be increased, whereby concentration of electric fields in the region near the edge of the second conducting film. Consequently, the capacitor can have large capacitance without lowering voltage resistance.

10 Claims, 40 Drawing Sheets

CAPACITOR AND SEMICONDUCTOR DEVICE AND METHOD FOR FABRICATING THE SEMICONDUCTOR DEVICE

This is a divisional of application Ser. No. 09/956,944, filed Sep. 21, 2001, now U.S. Pat. No. 6,624,501.

BACKGROUND OF THE INVENTION

The present invention relates to a capacitor, and a semiconductor device comprising the capacitor, more specifically to a capacitor using a dielectric thin film, and a semiconductor device comprising the capacitor.

The present invention also relates to a semiconductor device and a method for fabricating the semiconductor device, more specifically to a semiconductor device which can ensure stable operation in high frequency region, and a method for fabricating the semiconductor device.

Generally, a decoupling capacitor is mounted near an LSI (Large Scale Integrated Circuit), etc. mounted on a circuit wiring substrate, for the prevention of erroneous operation due to source voltage variations and high frequency noises.

The substrate of the decoupling capacitor is independent of the circuit wiring substrate and is suitably mounted on the circuit wiring substrate.

Recently, as LSIs, etc. have higher speed and lower power consumption, the decoupling capacitor is required to have characteristics improved. As LSIs, etc. are more down-sized, the decoupling capacitor is required to be down-sized.

Then, techniques of increasing capacitances while satisfying the requirement of down-sizing the decoupling capacitor have been proposed.

A proposed capacitor will be explained with reference to FIG. 36. FIG. 36 is a sectional view of the proposed capacitor.

As shown in FIG. 36, a conducting film 312 formed of a 50 nm-thickness Ti film and a 200 nm-thickness Pt film laid the latter on the former is formed on a silicon substrate 310. On the conducting film 312, a 200 nm-thickness dielectric film 314 of BST ($(Ba,Sr)TiO_3$), which is highly dielectric, is formed.

On the dielectric film 314, a conducting film 318 of a 200 nm-thickness Pt film is formed. On the conducting film 318, a dielectric film 322 is formed of a 200 nm-thickness BST film. The conducting film 322 is formed, covering the conducting film 318.

On the dielectric film 322, a conducting film 334 is formed of a 200 nm-thickness Pt film, connected to the conducting film 312 through an opening 324.

Further on the entire surface, a passivation film 338 of polyimide is formed. In the passivation film 338, a contact hole 340 and a contact hole 342 are formed respectively down to the conducting film 334 and the conducting film 318.

A conducting film 344 is formed on the inside surfaces of the contact holes 340, 342. Conductor plugs 346a, 346b of Pt are buried respectively in the contact holes 340, 342 with the conducting film 344 formed on the inside surfaces. Solder bumps 348a, 348b are formed respectively on the conductor plugs 346a, 346b.

The conducting film 312 and the conducting film 334 form a first electrode 350 of the capacitor. The first electrode 350 is electrically connected to electric source lines of, e.g., circuit wiring substrate (not shown) through the conductor plug 346a and the solder bump 348a, etc.

The conducting film 318 forms a second electrode 352 of the capacitor. The second electrode 352 is electrically connected to ground lines of, e.g., the circuit wiring substrate (now shown) through the conductor plug 346b, and the solder bump 348b, etc. The proposed capacitor 354 is thus formed.

In the capacitor shown in FIG. 36, a material of the dielectric films 314, 322 is BST, which is dielectric, and the dielectric films 314, 322 are as thin as 200 nm. The capacitor can have improve capacitances. Furthermore, in the capacitor shown in FIG. 36, the conducting films 312, 334 forming the first electrode 350 is formed are formed below and above the conducting film 318 forming the second electrode 352 respectively with the dielectric films 314, 322 intervening. Thus, the capacitor can increase capacitances while satisfying the requirement of down-sizing.

However, the capacitor shown in FIG. 36 has the voltage resistance lowered. Reasons for the lower voltage resistance have not been made clear, and the lower voltage resistance has been a barrier to practicing the proposed capacitor.

Recently, digital LSIs, etc., typically microprocessors, have the operation speed increased and the electric power consumption decreased.

In order to operate an LSI in a high frequency region of the GHz band and at low voltages, it is very important that source voltage variations due to abrupt load impedance variations of the LSI are depressed, and high frequency noises of the electric sources are removed.

Conventionally, the decoupling capacitor is mounted near an LSI or others mounted on a circuit wiring substrate, whereby source voltage variations are depressed, and high frequency noises are removed. The decoupling capacitor is formed on a substrate independent of the circuit wiring substrate and is suitably mounted on the circuit wiring substrate.

In mounting the decoupling capacitor near an LSI mounted on a circuit wiring substrate, the LSI and the decoupling capacitor are electrically connected through the wire formed on the circuit wiring substrate, and large inductance due to the wiring is present. When large inductance is present between the LSI and the decoupling capacitor, source voltage variations cannot be sufficiently depressed, and high frequency noises cannot be sufficiently removed.

Here, in order to shorten the wring between the LSI and decoupling capacitor, it is proposed to mount the decoupling capacitor directly on the LSI. Mounting the decoupling capacitor directly on the LSI will be able to decrease inductance between the LSI and the decoupling capacitor.

However, in simply mounting the decoupling capacitor directly on the LSI, the decoupling capacitor will be a barrier to flip chip bonding, which is advantageous for high speed operation.

The specification of Japanese Patent Laid-Open Publication No. Hei 9-223861/1997 discloses a technique of mounting a semiconductor chip on the surface of a circuit wiring substrate, mounting the decoupling capacitor on the back side of the circuit wiring substrate, and electrically connecting the semiconductor chip and the decoupling capacitor through a via formed in the circuit wiring substrate. However, some inductance is present due to the via formed in the circuit wiring substrate, whereby source voltage variations cannot be depressed sufficiently, and high frequency noises cannot be removed sufficiently.

The specification of Japanese Patent Laid-Open Publication No. Hei 5-102389/1993 discloses a technique of mounting the decoupling capacitor on a memory IC. A long wiring pattern is present between the source pins and ground pins of the memory IC, and the decoupling capacitor, which makes it impossible to sufficiently depress source voltage variations and to remove high frequency noises.

The specification of Japanese Patent Laid-Open Publication No. Hei 9-64236/1997 discloses a technique of mounting the decoupling capacitor directly on a semiconductor chip. However, the decoupling capacitor has a very large thickness, and is not able to satisfy the requirements of down-sizing and higher density.

In order to improve operation speed, further it is very important that the wiring between the decoupling capacitor and an LSI is short, and also the wiring between the LSI and the other passive members, such as resistors, inductors, etc., is short. To this end, a technique of shortening not only the wiring between the decoupling capacitor and an LSI, but also the wiring between passive devices other than the decoupling capacitor and the LSI has been needed.

SUMMARY OF THE INVENTION

An object of the present invention is to provide a capacitor which can improve capacitance without lowering voltage resistance, and a semiconductor device with the capacitor, and a semiconductor device having the capacitor.

Another object of the present invention is to provide a semiconductor device which can meet the requirements of down-sizing and higher density while being able to ensuring stable operation in high-frequency region, and a method for fabricating the semiconductor device.

According to one aspect of the present invention, there is provided a capacitor comprising a first conducting film formed on a substrate, a first dielectric film formed on the first conducting film, a second conducting film formed on the first dielectric film, a second dielectric film formed above the second conducting film, covering an edge of the second conducting film, and a third conducting film formed above the second dielectric film, covering a part of the second dielectric film covering the edge of the second conducting film, the capacitor further comprising: an insulation film covering said edge of the second conducting film or said part of the second dielectric film. An effective thickness of the insulation film between the second conducting film and the third conducing film in the region near the edge of the second conducting film can be increased, whereby concentration of electric fields in the region near the edge of the second conducting film. Consequently, the capacitor can have large capacitance without lowering voltage resistance.

According to another aspect of the present invention, there is provided a semiconductor device comprising a capacitor, the capacitor comprising a first conducting film formed on a substrate, a first dielectric film formed on the first conducting film, a second conducting film formed on the first dielectric film, a second dielectric film formed above the second conducting film, covering an edge of the second conducting film, and a third conducting film formed above the second dielectric film, covering a part of the second dielectric film covering the edge of the second conducting film, the capacitor further comprising: an insulation film covering said edge of the second conducting film or said part of the second dielectric film. The semiconductor device includes a capacitor of high voltage resistance and large capacitance, and can be highly reliable.

According to farther another aspect of the present invention, there is provided a semiconductor device comprising: a semiconductor element substrate; a passive component mounted on the semiconductor element substrate and electrically connected to electrodes of the semiconductor element substrate; column-shaped conductors formed on the semiconductor element substrate in a region other than a region where the passive component is mounted, and having a height which is substantially flush with at least the upper surface of the passive component, and an insulation layer burying the passive component and the column-shaped conductors, the upper surfaces of the column-shaped conductors being exposed on the surface of the insulation film. The passive component is mounted directly on the semiconductor element substrate, whereby the semiconductor element substrate and the passive component can be connected to each other at a very small distance. The column-shaped electrodes of a height which is substantially flush with the upper surface of the passive component are formed on the semiconductor element substrate, which allows the semiconductor element substrate to be flip chip-bonded to a circuit wiring substrate, etc. without interference by the passive component. Consequently, the semiconductor device can ensure stable operation in high frequency regions while satisfying the requirements of down-sizing and higher density.

According to farther another aspect of the present invention, there is provided a semiconductor device comprising a semiconductor element substrate, and a passive component mounted on the semiconductor element substrate and electrically connected to electrodes of the semiconductor element substrate, the passive component including a passive element formed on a side of a support substrate opposed to the semiconductor element substrate, and the passive component including electrodes electrically connected to the passive element through the support substrate and exposed on the upper surface of the support substrate, and through-electrodes electrically connected to the semiconductor element substrate through the passive component and insulated from the passive element. Signal lines of the semiconductor element substrate can be connected to a circuit wiring substrate, etc. through the through-electrodes, whereby the signal lines of the semiconductor element substrate can be electrically connected to the circuit wiring substrate, etc. without forming the column-shaped conductors separately from the passive component. Consequently, semiconductor fabrication steps can be simplified and contribute to lower costs.

According to farther another aspect of the present invention, there is provided a semiconductor device comprising a semiconductor element substrate, and a passive component including a passive element mounted on the semiconductor element substrate and electrically connected to electrodes of the semiconductor element substrate, the passive component including electrodes electrically connected to the passive element and exposed on the upper surface of the passive component, and through-electrodes electrically connected to the semiconductor element substrate through the passive component and insulated from the passive element. Signal lines of the semiconductor element substrate can be connected to a circuit wiring substrate, etc. through the through-electrodes, whereby the signal lines of the semiconductor element substrate can be electrically connected to the circuit wiring substrate, etc. without forming the column-shaped conductors separately from the passive component. Consequently, semiconductor fabrication steps can be simplified and contribute to lower costs.

According to farther another aspect of the present invention, there is provided a method for fabricating a semiconductor device comprising the steps of: forming column-shaped conductors on a semiconductor element substrate; mounting a passive component including a passive element formed on a side of a support substrate opposed to the semiconductor element substrate, on the semiconductor element substrate in a region other than a region where the column-shaped conductors are formed; forming an insulation layer, burying the column-shaped conductors and the passive component; and polishing the side of the upper surface of the support substrate together with the insulation layer. The side of the upper surface of the support substrate is polished, which makes it possible to thin the support substrate without breaking the passive component.

According to farther another aspect of the present invention, there is provided a method for fabricating a semiconductor device comprising the steps of: mounting on a semiconductor element substrate a passive component including a passive element formed on a side of a support substrate opposed to the semiconductor element substrate, electrodes electrically connected to the passive element through the support substrate and exposed on the upper surface of the support substrate, and through-electrodes passed through the support substrate and insulated from the passive element; and polishing the side of the upper surface of the support substrate. The side of the upper surface of the support substrate is polished, whereby a semiconductor device which can ensure stable operation in high frequency regions while satisfying the requirement of down-sizing and higher density can be provided.

According to the present invention, an effective thickness of the insulation film between the conducting film and the other conducting film is increased in the region near the edge of the conducting film, whereby concentration of electric fields on the region near the edge of the conducting film can be mitigated, and the capacitor can have larger capacitances without lower voltage resistance.

According to the present invention, the capacitor having high voltage resistance and large capacitances is mounted directly on an LSI, etc., whereby high frequency noises, etc. of source power can be removed very near the LSI, etc. Consequently, the present invention can provide semiconductor devices of high reliability.

According to the present invention, the capacitor is mounted directly on an LSI, whereby voltage variations of source power to be fed to the LSI can be effectively depressed, and high frequency noises of the source power to be fed to the LSI can be effectively removed. According to the present invention, the vias having a height substantially equal to the upper surface of the capacitor are formed on the electrodes of the LSI, whereby the LSI can be flip chip-bonded to a circuit wiring substrate or others without interference of the capacitor. According to the present invention, not only the capacitor but also other any passive components can be electrically connected to an LSI at a very short distance. Accordingly, the semiconductor device can satisfy the requirement of down-sizing and higher density while ensuring stable operation in high frequency regions.

According to the present invention, the capacitor is mounted on the entire surface of an LSI, whereby large capacitance can be ensured. Furthermore, according to the present invention, through-electrodes are provided in the capacitor, whereby the signal (S) lines of the LSI can be electrically connected to a circuit wiring substrate, etc. without forming the vias separately from the capacitor. Consequently, the present invention can provide a semiconductor device which can ensure stable operation in a high frequency region while satisfying the requirement of down sizing and higher density, and can contribute to simplifying the fabrication steps, low costs, etc.

DETAILED DESCRIPTION OF THE INVENTION

A First Embodiment

The principle of the present invention will be explained before the capacitor according to a first embodiment of the present invention is explained.

Figure 36:
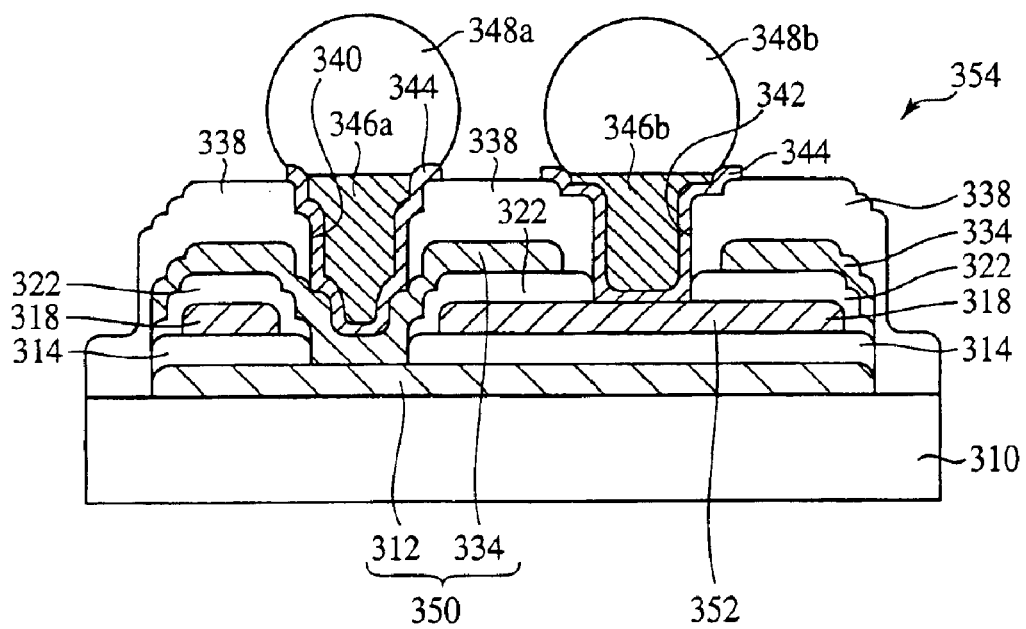
FIG. 36 is a sectional view of the proposed capacitor.

The inventors of the present invention made earnest studies of a mechanism for the low voltage resistance of the capacitor shown in FIG. 36 by using the following ideal model of the capacitor.

Figure 37A:
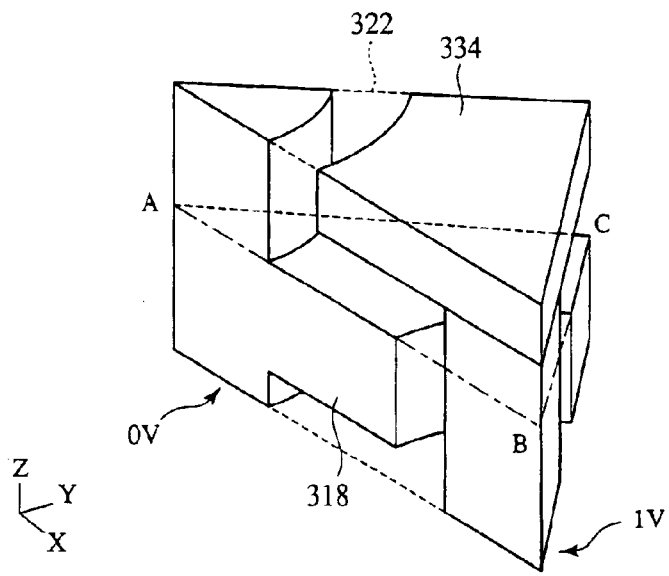
FIGS. 37A and 37B are schematic views of a part of an ideal capacitor model.

FIG. 37A is a schematic view of a part of an ideal model of the capacitor. In FIG. 37A, the part where a conducting film 318 and a conducting film 334 are opposed to each other is three-dimensionally shown. In this model, a dielectric film 322 has a uniform thickness. A potential at the lower end of the conducting film 318 is 0 V, and a potential at the lower end of the conducting film 334 is 1 V.

Figure 37B:
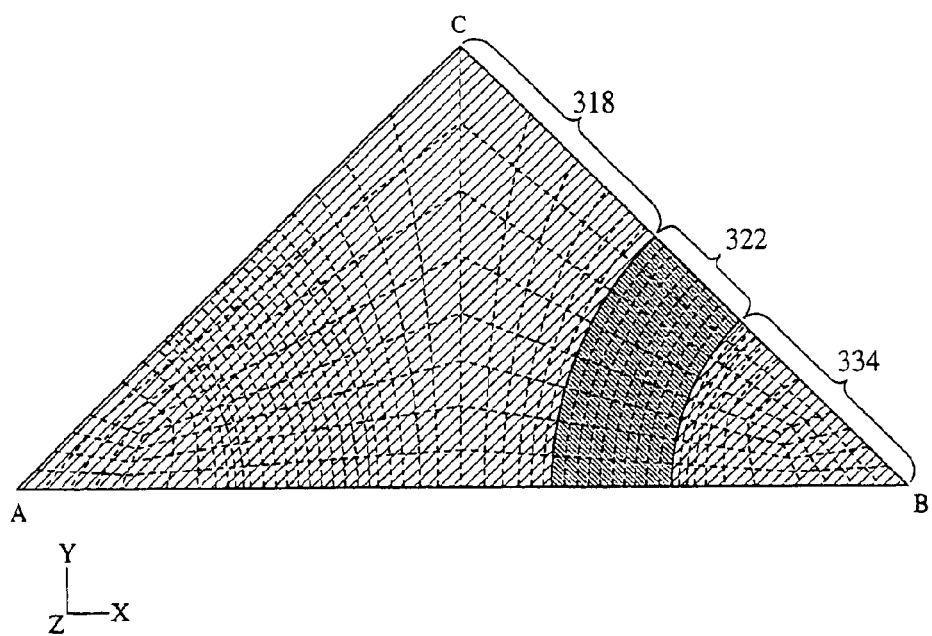

FIG. 37B is the sectional view along the plane ABC in FIG. 37A. The conducting film 318 and the conducting film 334 are opposed to each other across the dielectric film 322.

Figure 38:
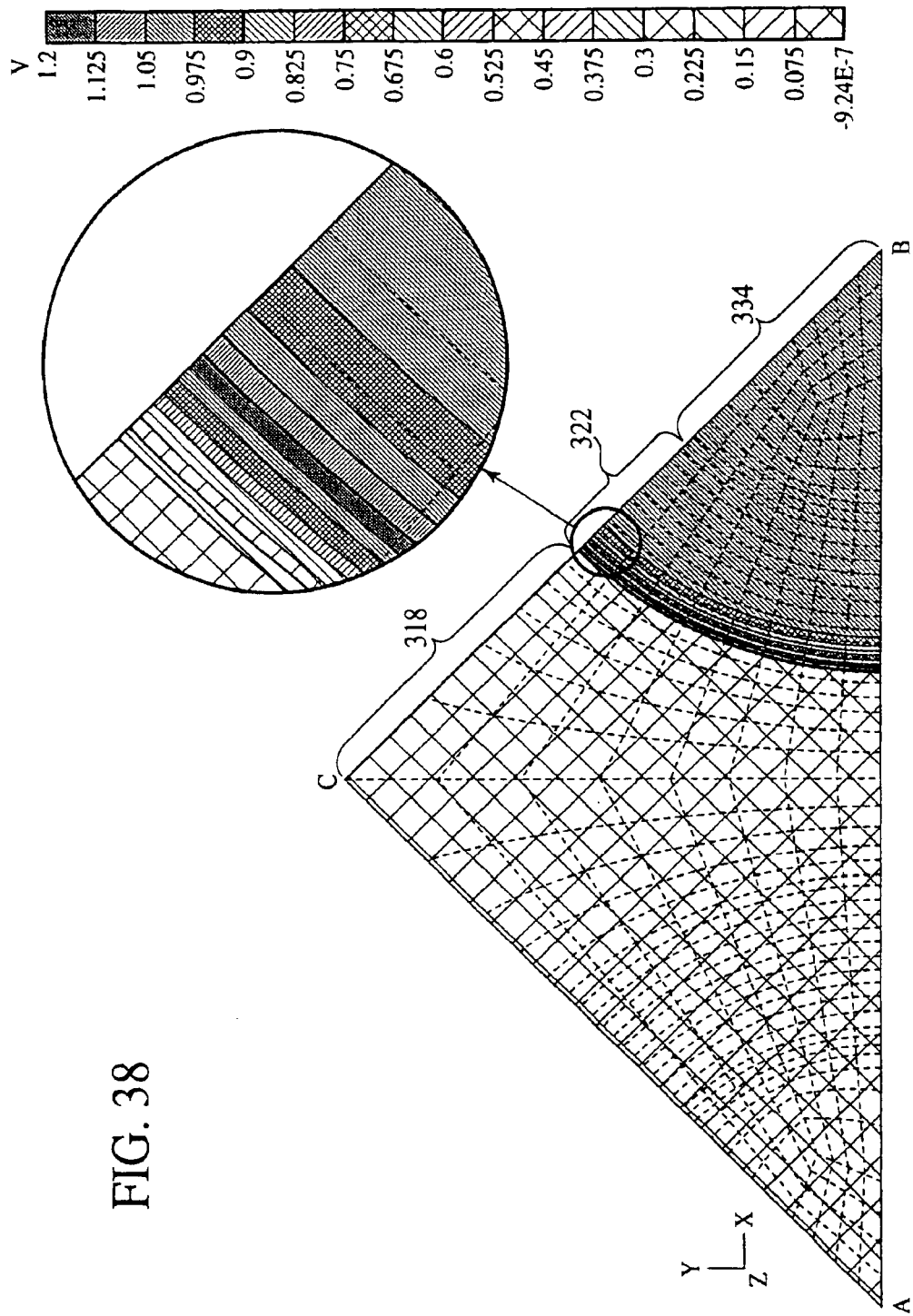
FIG. 38 is a view of a potential distribution of the capacitor.

FIG. 38 is a view of a potential distribution of the capacitor at the plane. The potential distribution was computed by finite element method. Computing conditions were a 200 nm film thickness of the dielectric film 322, a 350 relative dielectric constant of the dielectric film 322, 1.0 relative dielectric constants of the conducting films 318, 334, and $10 \times 10^6$ S/m electric conductivities of the conducting films 318, 334.

As shown in FIG. 38, according to the computation, a potential is as high as 1.2 V in a region near the edge of the conducting film 318. Based on this, a region where an electric field strength is high is produced near the region near the edge of the conducting film 318.

Figure 39:
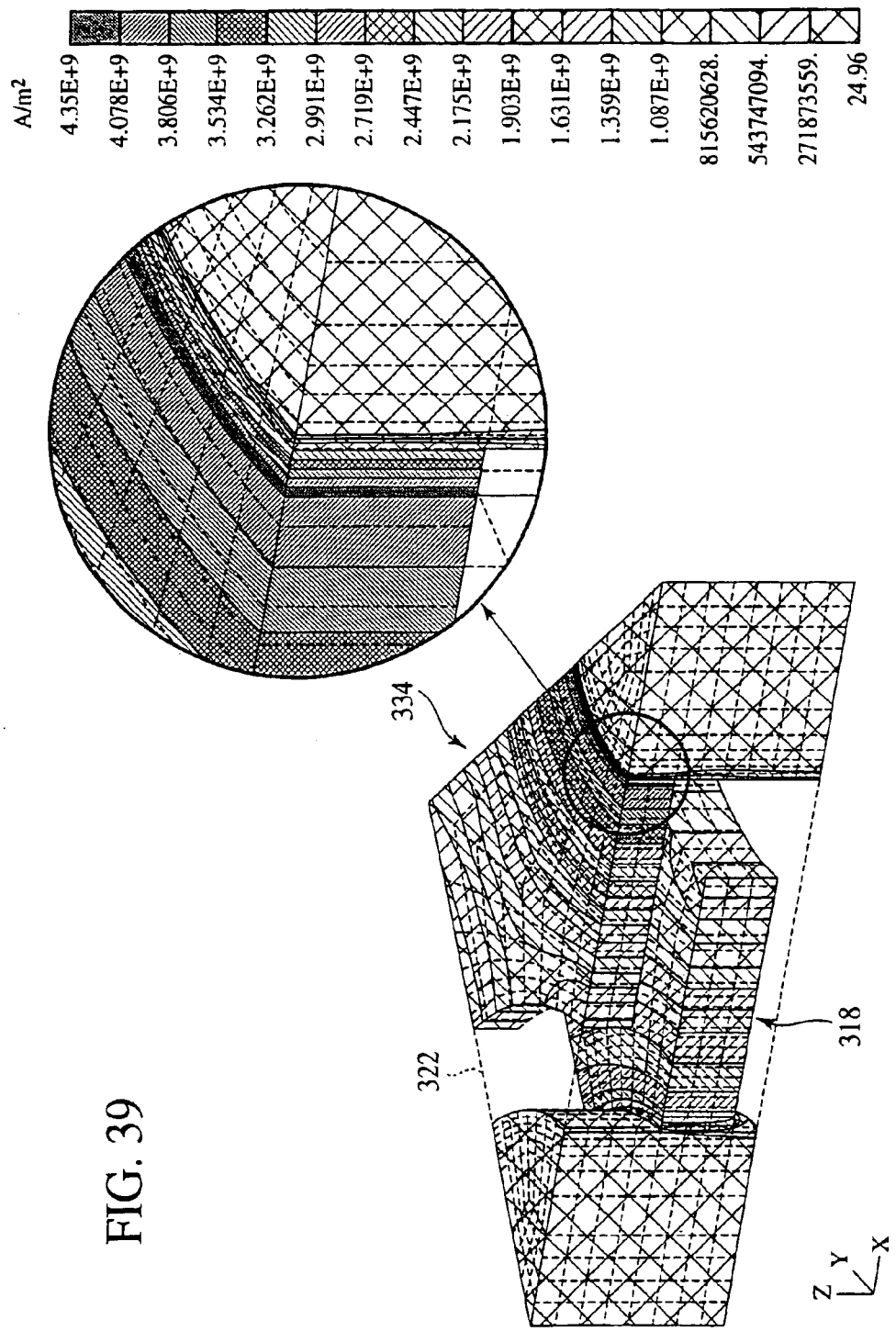
FIG. 39 is a view of a leak current distribution of the capacitor.

FIG. 39 is a view of a leak current distribution of the capacitor. The leak currents were computed by finite element method. Computing conditions were the same as those for computing the above-described electric field strength distribution. As seen in FIG. 39, large leak currents flow in a region near the edge of the conducting film 318.

As seen based on those facts, electric fields are concentrated in the region near the edge of the conducting film 318, and leak currents are accordingly high.

That is, the computation made by the inventors of the present invention found that insulation breakage of the dielectric film 322 tends to occur in the region near the edge of the conducting film 318, which is a factor for the low voltage resistance of the capacitor shown in FIG. 36.

Figure 40:
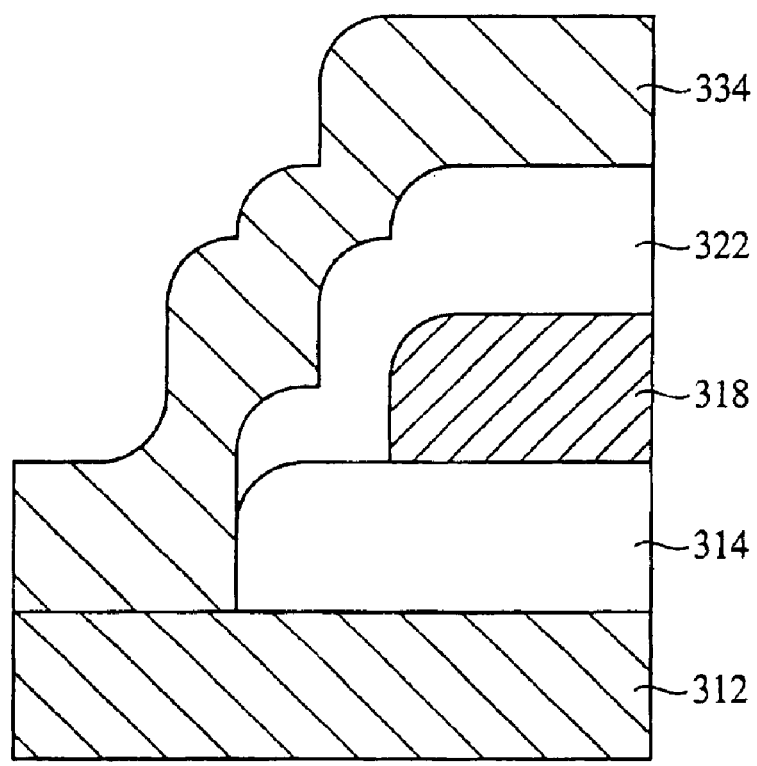
FIG. 40 is a sectional view of a part of the proposed capacitor.

The above-described computation by finite element method did not take into account the step coverage of the dielectric film 322. Actually, however, as shown in FIG. 40, the dielectric film 322 tends to be thinner at the part thereof covering the edge of the conducting film 318. Insulation breakage tends to take place at the thinner part of the dielectric film 322. That will be a factor for the low voltage resistance of the capacitor shown in FIG. 36.

Then, the inventors of the present invention obtained an idea that an effective insulation film thickness between the conducting films is increased in the region near the edge of the conducting film, whereby the capacitor can have higher voltage resistance. The concentration of electric fields in the region near the edge of the conducting film can be thus mitigated, with a result that the capacitor can have higher voltage resistance.

(Capacitor)

Figure 1:
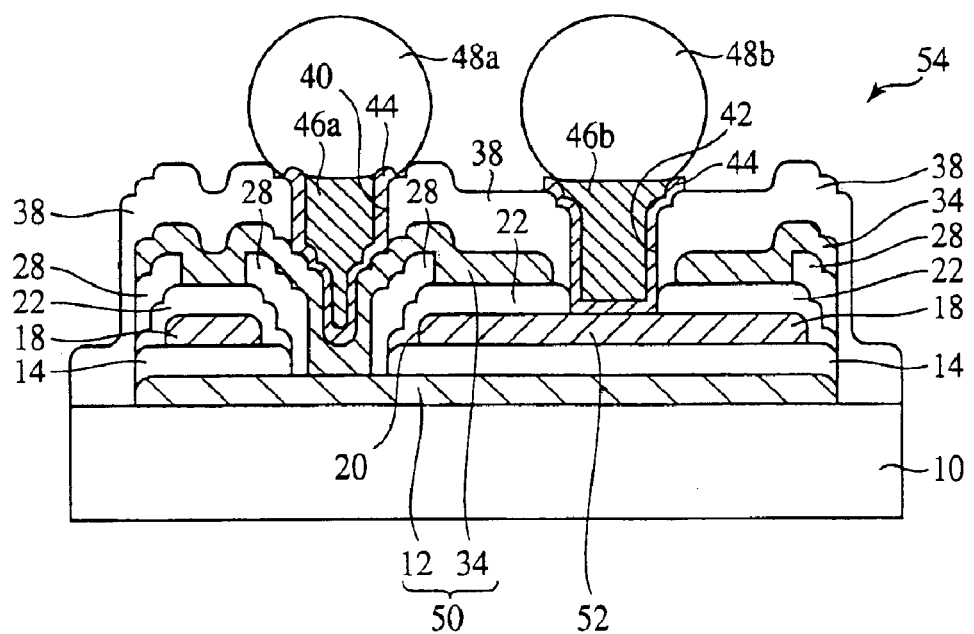
FIG. 1 is a sectional view of the capacitor according to a first embodiment of the present invention.

The capacitor according to the first embodiment of the present invention will be explained with reference to FIG. 1. FIG. 1 is a sectional view of the capacitor according to the present embodiment.

As shown in FIG. 1, a conducting film 12 of a layer structure of a 50 nm-thickness Ti film (not shown) and a 200 nm-thickness Pt film (not shown) sequentially formed the latter on the former.

On the conducting film 12, a dielectric film 14 of a 200 nm-thickness BST $(Ba,Sr)TiO_3$), which is highly dielectric, is formed. Here, the highly dielectric is a dielectric whose relative dielectric constant is higher than the dielectric constant of silicon dioxide, 3.8.

On the dielectric film 14, a conducting film 18 is formed of a 200 nm-thickness Pt film.

On the conducting film 18, a dielectric film 22 is formed of a 200 nm-thickness BST film. The dielectric film 22 is formed, covering the edges of the conducting film 18, specifically the inner edge of an opening 20 in the conducting film 18, and the outer edge of the conducting film 18. Steps are formed at the edges of the conducting film 18.

An insulation film 28 of a 200 nm-thickness polyimide film is formed in a region near the edge of the conducting film 18, covering a part of the dielectric film 22 covering the edge of the conducting film 18. Polyimide used as a material of the insulation film 28 has higher voltage resistance than the material used as the dielectric film 22.

On the dielectric film 22, a conducting film 34 of a 200 nm-thickness Pt film is formed. The conducting film 34 is formed, covering the insulation film 28 and is connected to the conducting film 12.

Furthermore, on the entire surface, a passivation film 38 is formed of 1 $\mu$m-thickness polyimide film. A contact hole 40 which reaches the conducting film 34, and a contact hole 42 which reaches the conducting film 18 are formed in the passivation film 38.

A conducting film 44 of the Pt is formed on the inside surface of the contact holes 40, 42. Conductor plugs 46a, 46b of Pt are formed in the contact holes 40, 42 with the conducting film 44 formed on the inside surfaces.

Solder bumps 48a, 48b are formed respectively of 96.5% Sn–3.5% Ag on the conductor plugs 46a, 46b.

The conducting film 12 and the conducting film 34 form a first electrode 50 of the capacitor. The first electrode 50 is electrically connected to the source lines of, e.g., a circuit wiring substrate (not shown) through the conductor plug 46a, the solder bump 48a, etc.

The conducting film 18 forms a second electrode 52 of the capacitor. The second electrode 52 is electrically connected to the ground lines of, e.g., the circuit wiring substrate (not shown) through the conductor plug 46b, the solder bump 48b, etc.

Thus, the capacitor 54 according to the present embodiment comprising the first electrode 50, the dielectric films 14, 22 and the second electrode 52 is formed.

The capacitor according to the present embodiment is characterized mainly in that the insulation film 28 is formed, covering a part of the dielectric film 22 covering the edge of the conducting film 18.

In the capacitor shown in FIG. 36, electric fields are concentrated on the region near the edge of the conducting film 318, and the step coverage by the dielectric film 322 in the region near the edge of the conducting film 318 is not good, which causes the dielectric film 322 to easily undergo insulation breakage. Thus, the capacitor shown in FIG. 36 cannot sufficiently ensure voltage resistance.

In contrast to this, in the present embodiment, the insulation film 28 of polyimide is formed, covering a part of the dielectric film 22 covering the edge of the conducting film 18, whereby an effective insulation film thickness between the conducting film 18 and the conducting film 34 in the region near the edge of the conducting film 18 is increased. As a result, according to the present embodiment, the concentration of electric fields on the region near the edge of the conducting film 18 can be mitigated, and a capacitance of the capacitor can be increased without lowering the voltage resistance.

(Method for Fabricating the Capacitor)

Then, the method for fabricating the capacitor according to the present embodiment will be explained with reference to FIGS. 2A to 6. FIGS. 2A to 6 are sectional views of the capacitor in the steps of the method for fabricating the same, which shows the method.

Figure 2A:
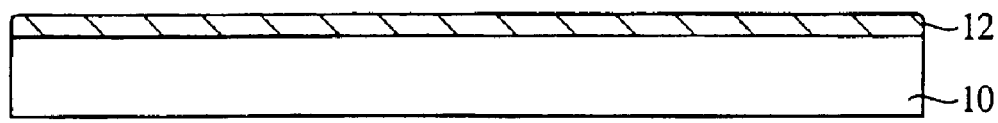
FIGS. 2A to 2E are sectional views of the capacitor according to the first embodiment of the present invention in the steps of the method for fabricating the capacitor, which show the method (Part 1).

First, as shown in FIG. 2A, a 50 nm-thickness Ti film (not shown) is formed on the entire surface of a silicon substrate 10 by sputtering. Then, a 200 nm-thickness Pt film (not shown) is formed on the entire surface by sputtering. The conducting film 12 of the Ti film and the Pt film laid the other on the one is formed.

Figure 2B:
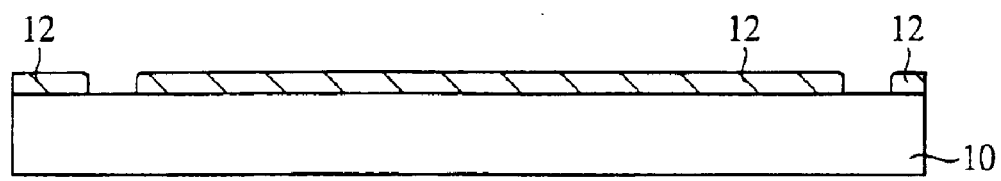

Then, as shown in FIG. 2B, the conducing film 12 is patterned by photolithography and Ar ion milling.

Figure 2C:
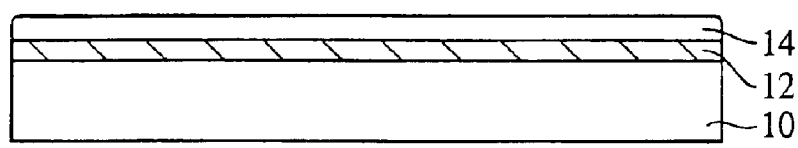

Then, as shown in FIG. 2C, the dielectric film 14 of BST is formed on the entire surface by sol-gel process. Sol-gel process is a wet film forming process using an organic metal solution as a raw material. With alkoxide as a starting solution, spin coating of, e.g., 2000 rpm is performed for 30 seconds to form BST film of, e.g., a 100 nm-thickness. Then, the BST film is dried at 120° C. and then pre-sintered at 400° C. The formation, drying and pre-sintering of BST film are performed twice to form BST film of, e.g., a 200 nm-thickness. Then, the BST film is sintered at 650° C. Thus, the dielectric film 14 of BST of, e.g., a 200 nm-film thickness, a 400 relative dielectric constant and a below 2% dielectric loss can be formed.

In the present embodiment, the BST film is formed by sol-gel process, but the process for forming the BST film is not limited to sol-gel process. The BST film may be formed by, e.g., sputtering. Film forming conditions for forming the BST film by sputtering are, e.g., 80 sccm Ar gas flow rate, 10 sccm $O_2$ gas flow rate, 30 mTorr vacuum degree, 500 W applied electric power and 1 hour-sputtering. Under these conditions, BST film of, e.g., a 200 nm-thickness and 500 relative dielectric constant can be formed.

Figure 2D:
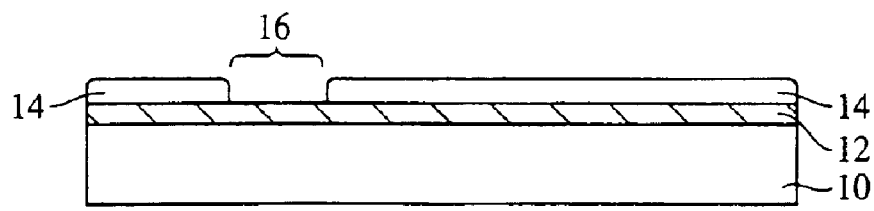

Then, as shown in FIG. 2D, the dielectric film 14 is patterned by photolithography and wet etching, and the opening 16 is formed in the dielectric film 14 down to the conducting film 12. An etchant can be, e.g., a buffer hydrofluoric acid solution of ammonium fluoride ($NH_4F$) and hydrofluoric acid (HF) mixed in a ratio of 6:1.

In the present embodiment, the dielectric film 14 is wet etched, but the method for etching the dielectric film 14 is not limited to wet etching. For example, Ar ion milling or others may be used.

Figure 2E:
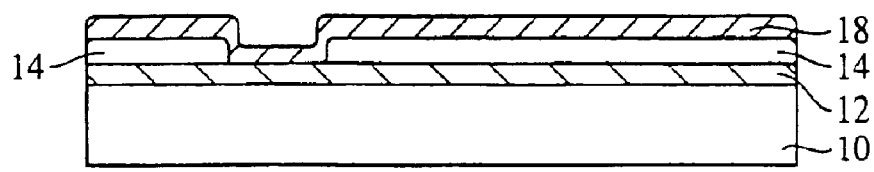

Then, as shown in FIG. 2E, the conducting film 18 of a 200 nm-thickness Pt film is formed on the entire surface by sputtering.

Figure 3A:
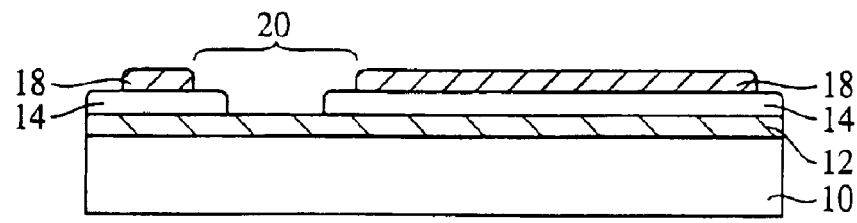
FIGS. 3A to 3D are sectional views of the capacitor according to the first embodiment of the present invention in the steps of the method for fabricating the capacitor, which show the method (Part 2).

Then, as shown in FIG. 3A, the conducting film 18 is patterned by photolithography, and an opening 20 is formed in the conducting film 18 down to the conducting film 12.

Figure 3B:
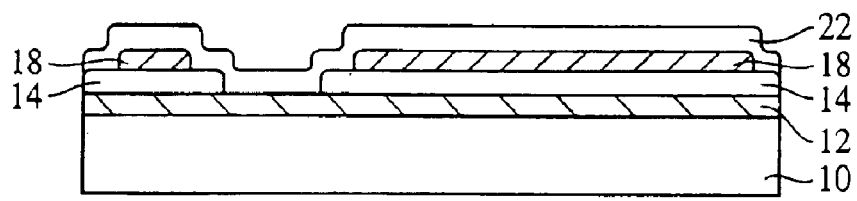

Next, as shown in FIG. 3B, the dielectric film 22 is formed of a 200 nm-thickness BST film on the entire surface. The dielectric film 22 can be formed by the same processing by which the dielectric film 14 was formed as described with reference to FIG. 2C.

Figure 3C:
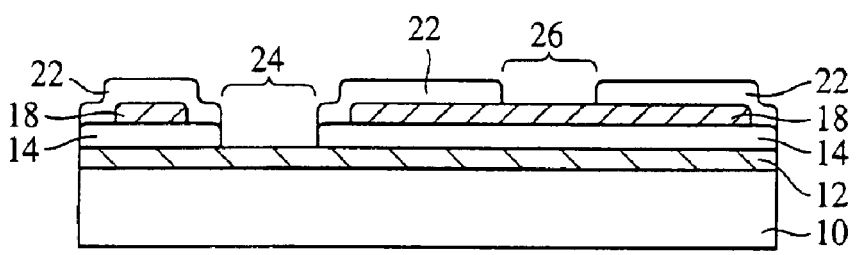

Then, as shown in FIG. 3C, the dielectric film 22 is patterned by photolithography, and in the dielectric film 22, an opening 24 is formed down to the conducting film 12 and an opening 26 down to the conducting film 18.

Figure 3D:
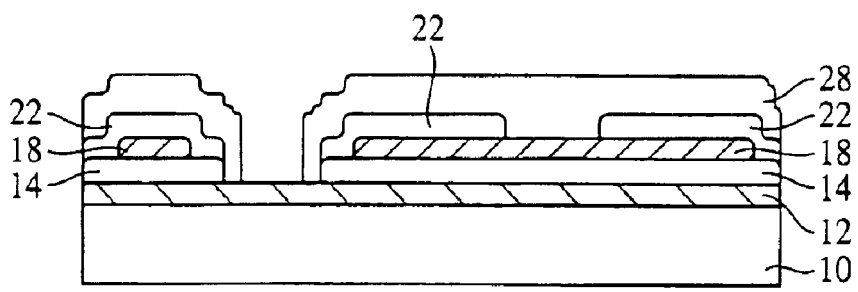

Next, as shown in FIG. 3D, the insulation film 28 of a 200 nm-thickness photosensitive polyimide film is formed on the entire surface by spin coating.

Figure 4A:
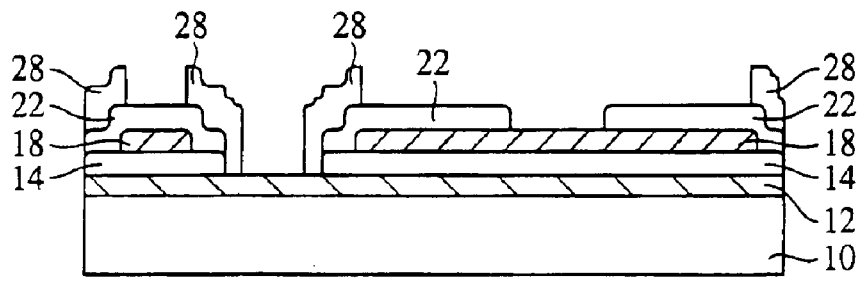
FIGS. 4A to 4D are sectional views of the capacitor according to the first embodiment of the present invention in the steps of the method for fabricating the capacitor, which show the method (Part 3).

Then, as shown in FIG. 4A, the insulation film 28 is patterned by photolithography, and the insulation film 28 is formed, covering the dielectric film 22 covering the edge of the conducting film 18.

Figure 4B:
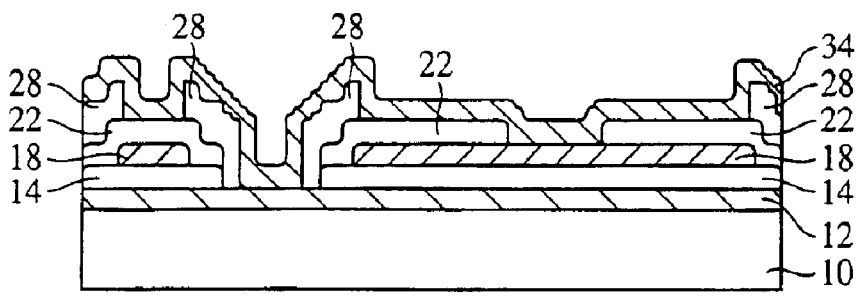

Next, as shown in FIG. 4B, the conducting film 34 of a 200 nm-thickness Pt film is formed on the entire surface by sputtering.

Figure 4C:
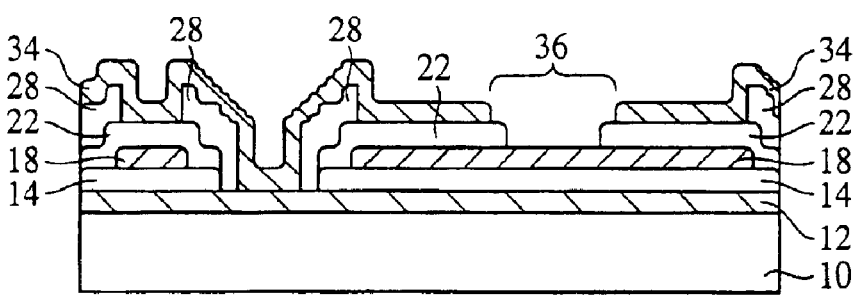

Then, as shown in FIG. 4C, the conducting film 34 is patterned by photolithography, and an opening 36 is formed in the conducting film 34 down to the conducting film 18.

Figure 4D:
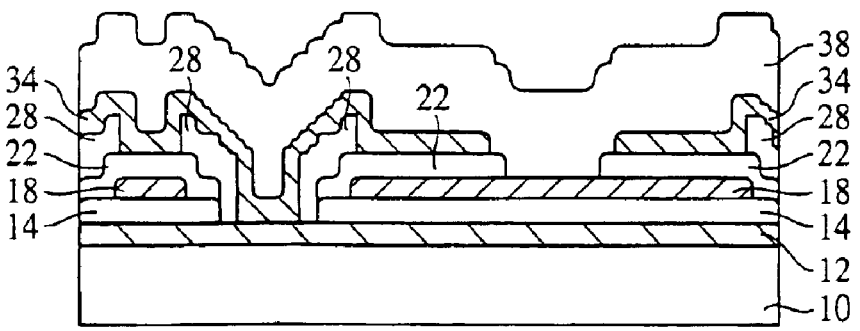

Next, as shown in FIG. 4D, the passivation film 38 is formed of a 1 μm-thickness polyimide film on the entire surface by spin coating.

Figure 5A:
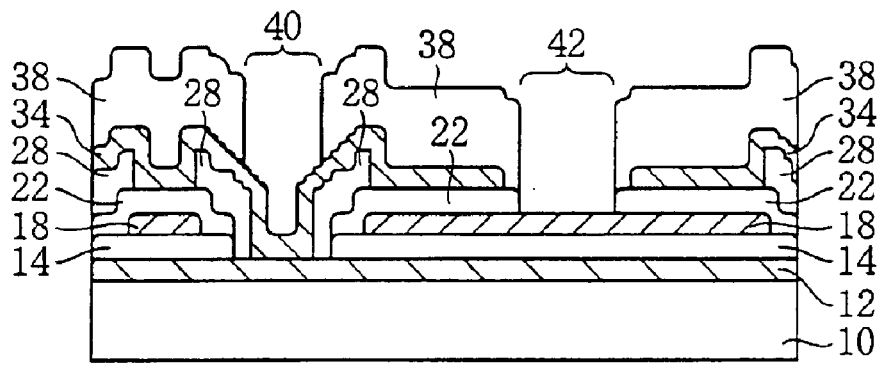
FIGS. 5A to 5C are sectional views of the capacitor according to the first embodiment of the present invention in the steps of the method for fabricating the capacitor, which show the method (Part 4).

Then, as shown in FIG. 5A, the passivation film 38 is patterned by photolithography, and in the passivation film 38, the contact hole 40 and the contact hole 42 are formed respectively down to the conducting film 34 and down to the conducting film 18.

Figure 5B:
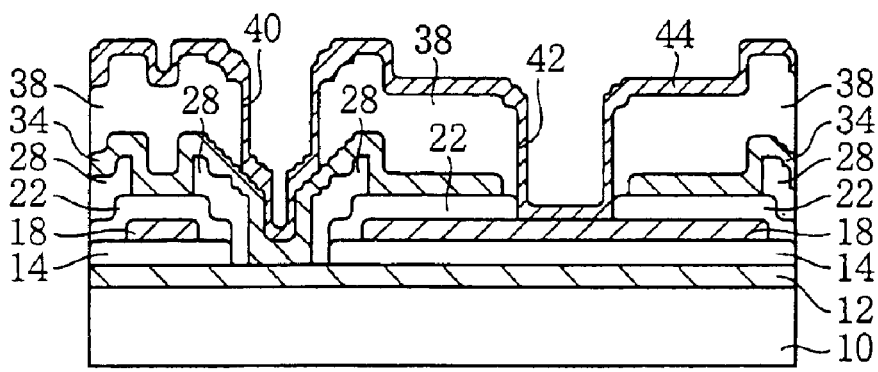

Next, as shown in FIG. 5B, the conducting film 44 is formed of Pt by sputtering, and the conducting film 44 is formed on the inside surfaces of the contact holes 40, 42.

Figure 5C:
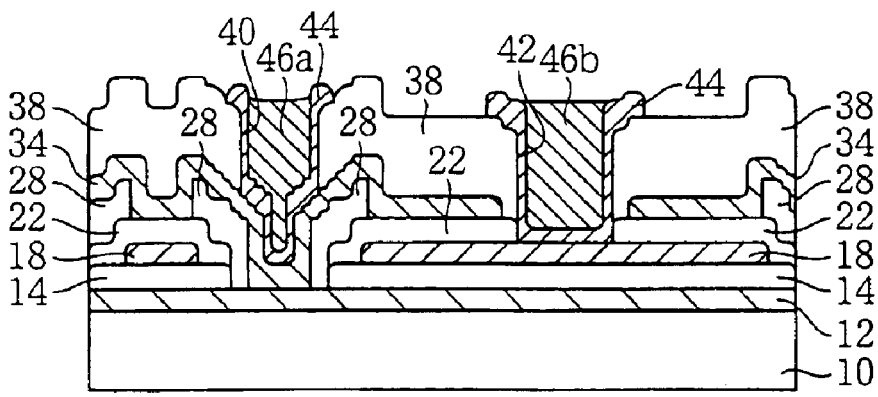

Then, as shown in FIG. 5C, the conducting film 44 is patterned by photolithography.

Next, the conductor plugs 46a, 46b are formed by plating in the contact holes 40, 42 with the conducting film 44 formed on the inside surface.

Figure 6:
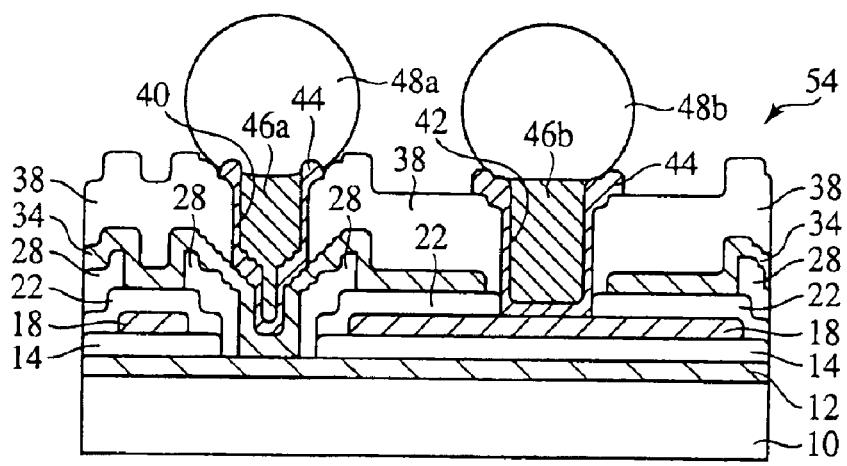
FIG. 6 is sectional views of the capacitor according to the first embodiment of the present invention in the steps of the method for fabricating the capacitor, which show the method (Part 5).

Then, as shown in FIG. 6, the solder bumps 48a, 48b formed of 96.5% Sn–3.5% Ag are formed respectively on the conductor plugs 46a, 46b.

Thus, the capacitor according to the present embodiment is formed.

A Second Embodiment

Figure 7:
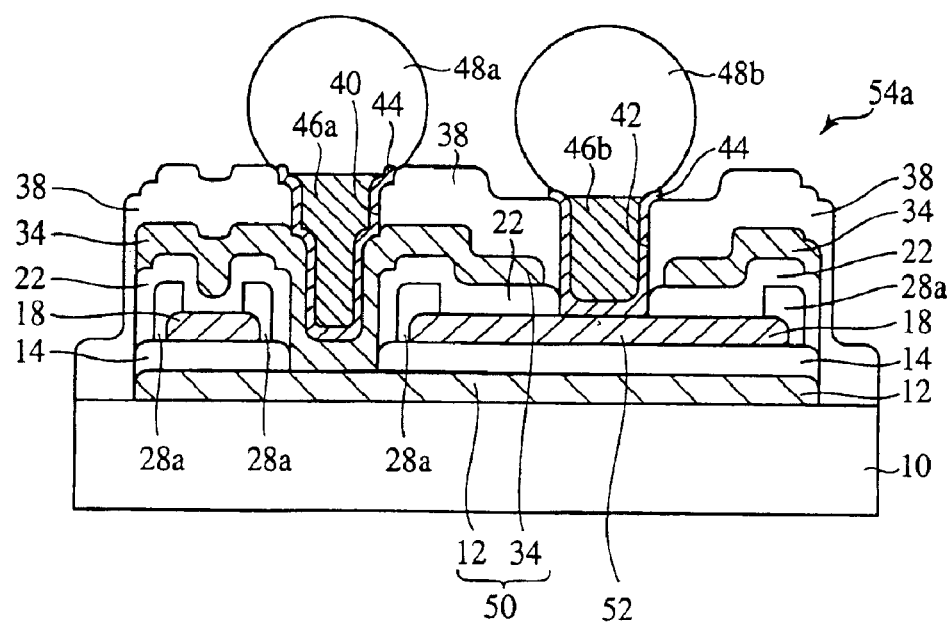
FIG. 7 is a sectional view of the capacitor according to a second embodiment of the present invention.

The capacitor according to a second embodiment of the present invention and the method for fabricating the capacitor will be explained with reference to FIGS. 7 to 10. FIG. 7 is a sectional view of the capacitor according to the present embodiment. FIGS. 8A to 10C are sectional views of the capacitor according to the present embodiment in the steps of the method for fabricating the same, which explain the method. The same members of the present embodiment as those of the capacitor according to the first embodiment and the method for fabricating the capacitor, shown in FIGS. 1 to 6, are represented by the same reference numbers not to repeat or to simplify their explanation.

(Capacitor)

The capacitor according to the present embodiment will be explained with reference to FIG. 7.

As shown in FIG. 7, the capacitor 54a according to the present embodiment is mainly characterized in that an insulation film 28a is formed, covering the edge of a conducting film to thereby increase an effective insulation film thickness between the conducting film 18 and a conducting film 34 in the region near the edge of the conducting film 18. In the capacitor 54 according to the first embodiment, the insulation film 28 is formed between the dielectric film 22 and the conducting film 34 in the region near the edge of the conducting film 18 to thereby increase an effective insulation film thickness between the conducting film 18 and the conducting film 34. In the present embodiment, however, the insulation film 28a is formed between the conducting film 18 and the dielectric film 22 to thereby increase an effective insulation film thickness between the conducting film 18 and the conducting film 34 in the region near the edge of the conducting film 18.

As shown in FIG. 7, the insulation film 28a of a 200 nm-thickness silicon dioxide film is formed, covering the edge of the conducting film 18. In the present embodiment, silicon dioxide is used as a material of the insulation film 28a, because silicon dioxide is resistive to high-temperature heat treatment for sintering BST film. In the first embodiment, polyimide, which is not resistive to high-temperature heat treatment, is used as a material of the insulation film 28 without any remarkable trouble, because the insulation film 28 is formed after BST film forming the dielectric film 22 has been formed. However, in the present embodiment, after the insulation film 28a has been formed, the dielectric film 22 of BST is formed, and the insulation film 28a must be formed of a material which can resistive to the high-temperature heat treatment for sintering the BST film. For this reason, silicon dioxide is used as a material of the insulation film 28a in the present embodiment.

As described above, according to the present embodiment, even in a case that the insulation film 28a is formed between the conducting film 18 and the dielectric film 22, covering the edge of the conducting film 18, an effective insulation film thickness can be increased between the conducting film 18 and the conducting film 34 in the region near the edge of the conducting film 18. Consequently, according to the present embodiment, a capacitor of large capacitance can be provided without lowering the voltage resistance as in the first embodiment.

(Method for Fabricating the Capacitor)

Then, the method for fabricating the capacitor according to the present embodiment will be explained with reference to FIGS. 8A to 10C.

The steps up to the step of patterning the conductor film 18 including the conductor film 18 patterning step are the same as those of the method for fabricating the capacitor according to the first embodiment, and their explanation is not repeated.

Figure 8A:
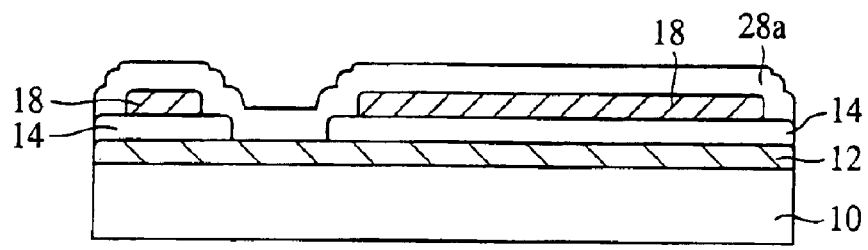
FIGS. 8A to 8D are sectional views of the capacitor according to the second embodiment in the steps of the method for fabricating the capacitor, which explain the method (Part 1).

Then, as shown in FIG. 8A, the insulation film 28a of a 200 nm-thickness silicon dioxide film is formed on the entire surface by sol-gel process.

Figure 8B:
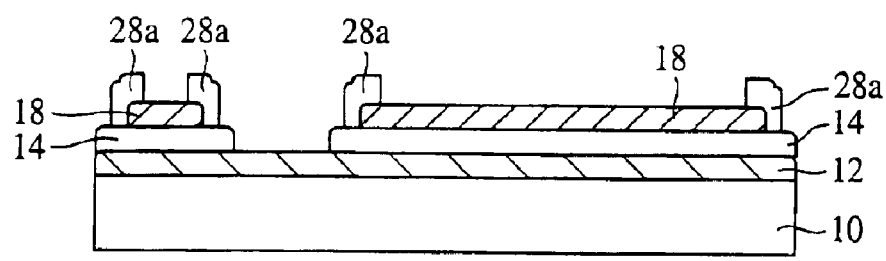

Then, as shown in FIG. 8B, the insulation film 28a is patterned by photolithography, and the insulation film 28a, covering the edge of the conducting film 18.

Figure 8C:
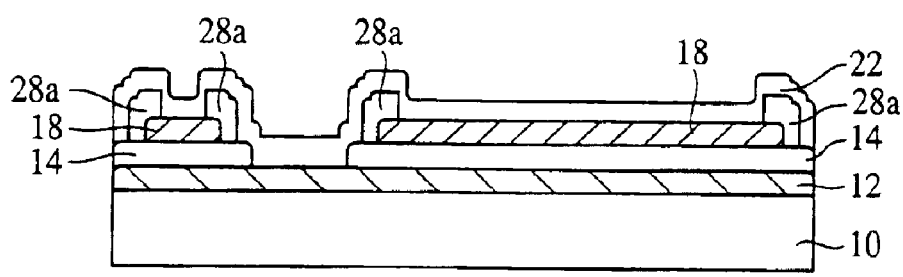

Next, as shown in FIG. 8C, the dielectric film 22 is formed of a 200 nm-thickness BST film on the entire surface.

Figure 8D:
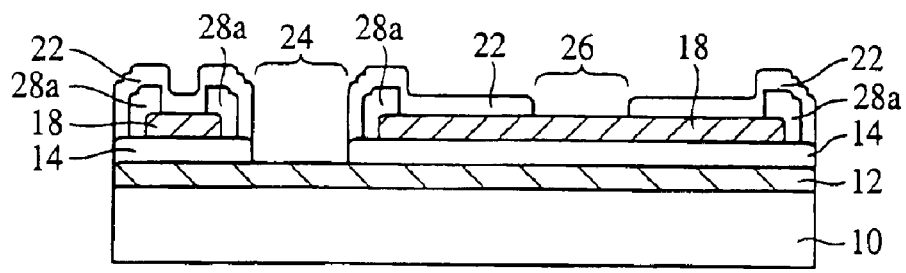
Figure 9A:
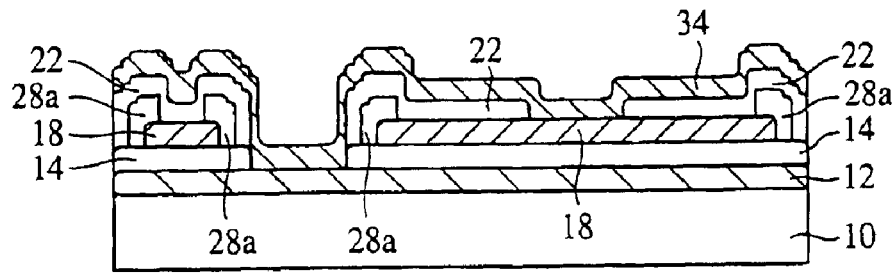
FIGS. 9A to 9D are sectional views of the capacitor according to the second embodiment in the steps of the method for fabricating the capacitor, which explain the method (Part 2).
Figure 9B:
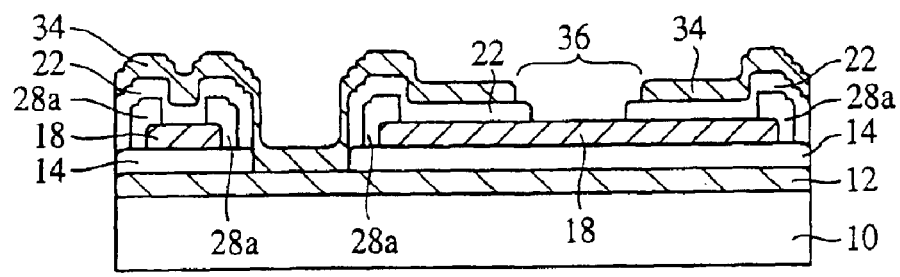
Figure 9C:
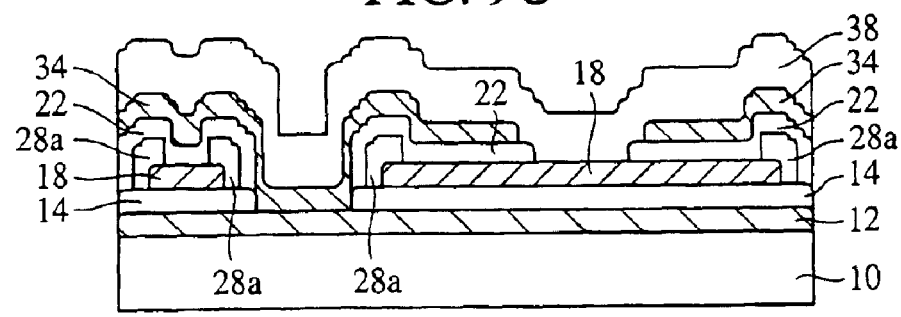
Figure 9D:
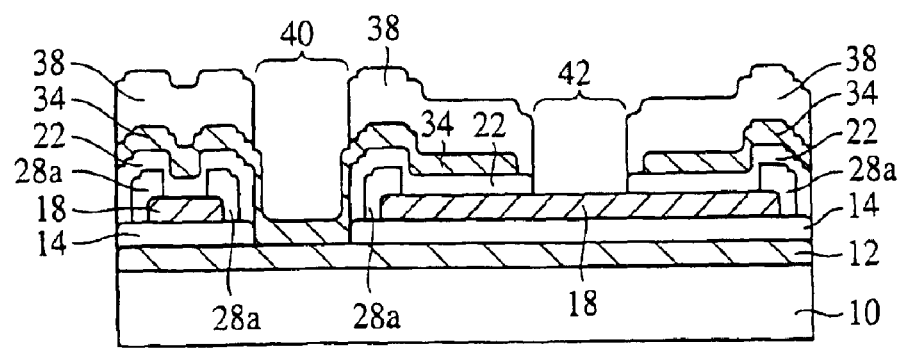
Figure 10A:
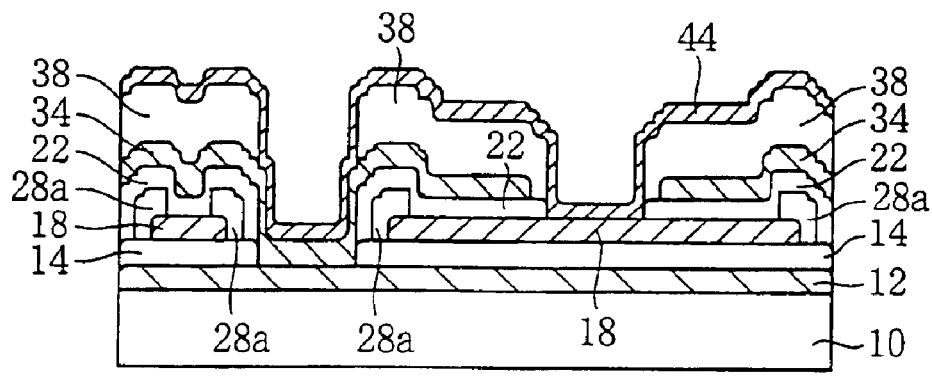
FIGS. 10A to 10C are sectional views of the capacitor according to the second embodiment in the steps of the method for fabricating the capacitor, which explain the method (Part 3).
Figure 10B:
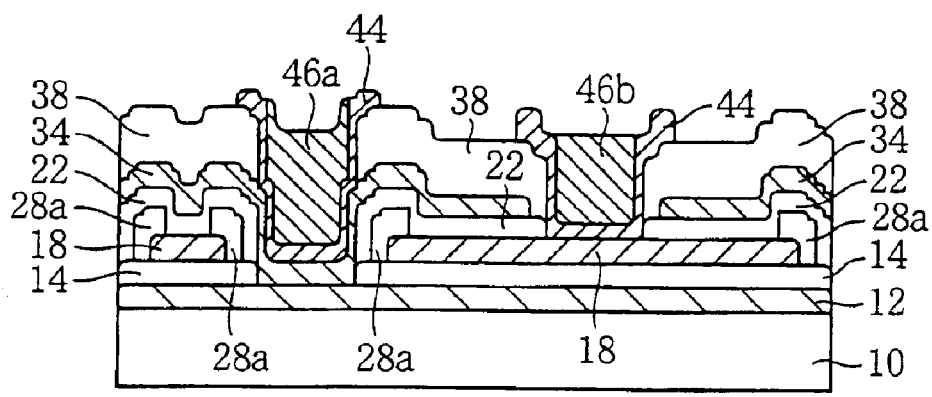
Figure 10C:
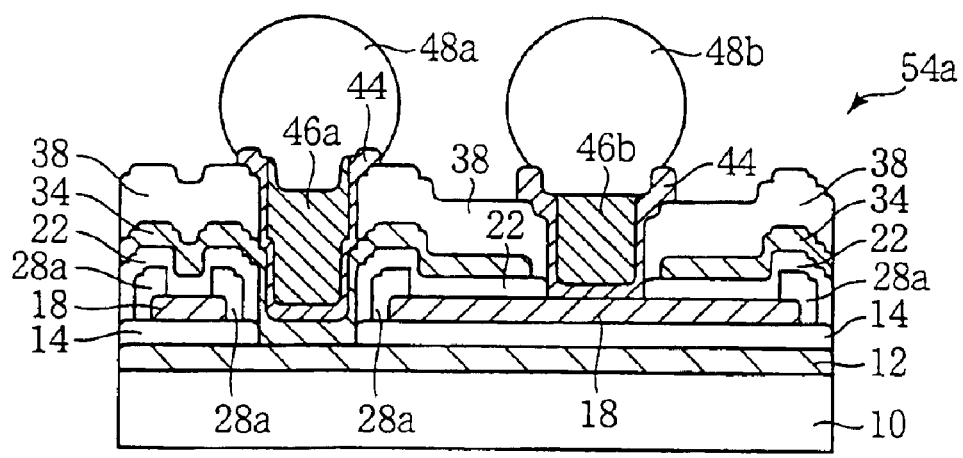

Then, as shown in FIG. 8D, the dielectric film 22 is patterned by photolithography, and in the dielectric film 22, the opening 24 and the opening 26 are formed respectively down to the conducting film 12 and down to the conducting film 18.

The following step of the method for fabricating the capacitor, shown in FIGS. 9A to 10C, are the same as those of the method for fabricating the capacitor according to the first embodiment shown in FIGS. 4B to 6, and their explanation is not repeated.

The capacitor according to the present embodiment is thus fabricated.

A Third Embodiment

Figure 11:
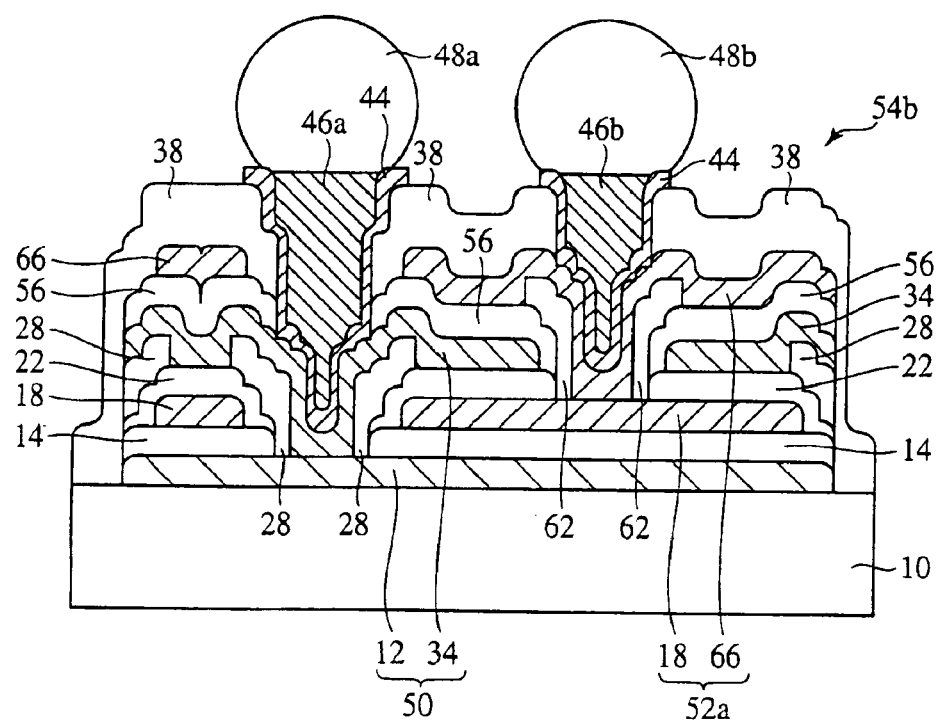
FIG. 11 is a sectional view of the capacitor according to a third embodiment of the present invention.

The capacitor according to a third embodiment of the present invention will be explained with reference to FIG. 11. FIG. 11 is a sectional view of the capacitor according to the present embodiment. The same members of the present embodiment as those of the capacitor according to the second embodiment and the method for fabricating the capacitor, shown in FIGS. 1 to 10C are represented by the same reference numbers not to repeat or to simplify their explanation.

The capacitor 54b according to the present embodiment is characterized mainly in that a dielectric film 56 and a conducting film 66 are formed further on a conducting film 34 so that the electrodes have increased areas for increased capacitance of the capacitor.

As shown in FIG. 11, a dielectric film 56 of a 200 nm-thickness BST is formed on the conducting film 34. The dielectric film 56 is formed, covering the edge of the conducting film 34.

In the region near the conducting film 34, an insulation film 62 of a 200 nm-thickness silicon dioxide film is formed, covering a part of the dielectric film 56 covering the edge of the conducting film 34.

A conducting film 66 of a 200 nm-thickness Pt film is formed on the dielectric film 56. The conducting film 66 is formed, covering the insulation film 62 and connected to the conducting film 18.

The conducting film 12 and the conducting film 34 form a first electrode 50 of the capacitor. The first electrode 50 of the capacitor is electrically connected to electric source lines of, e.g., a circuit wiring substrate (not shown) through a conductor plug 46a, a solder bump 48a, etc.

The conducting film 18 and the conducting film 66 form a second electrode 52a of the capacitor. The electrode 52a of the capacitor is electrically connected to ground lines of, e.g., the circuit wiring substrate (not shown) through the conductor plug 46b, the solder bump 48b, etc.

Thus, the capacitor 54b comprising the first electrode 50, the dielectric films 14, 22, 56, and the second electrode 52a is fabricated.

As described above, according to the present embodiment, the electrodes can have increased areas without lowering the voltage resistance, whereby the capacitor can have larger capacitance.

(Modification)

Figure 12:
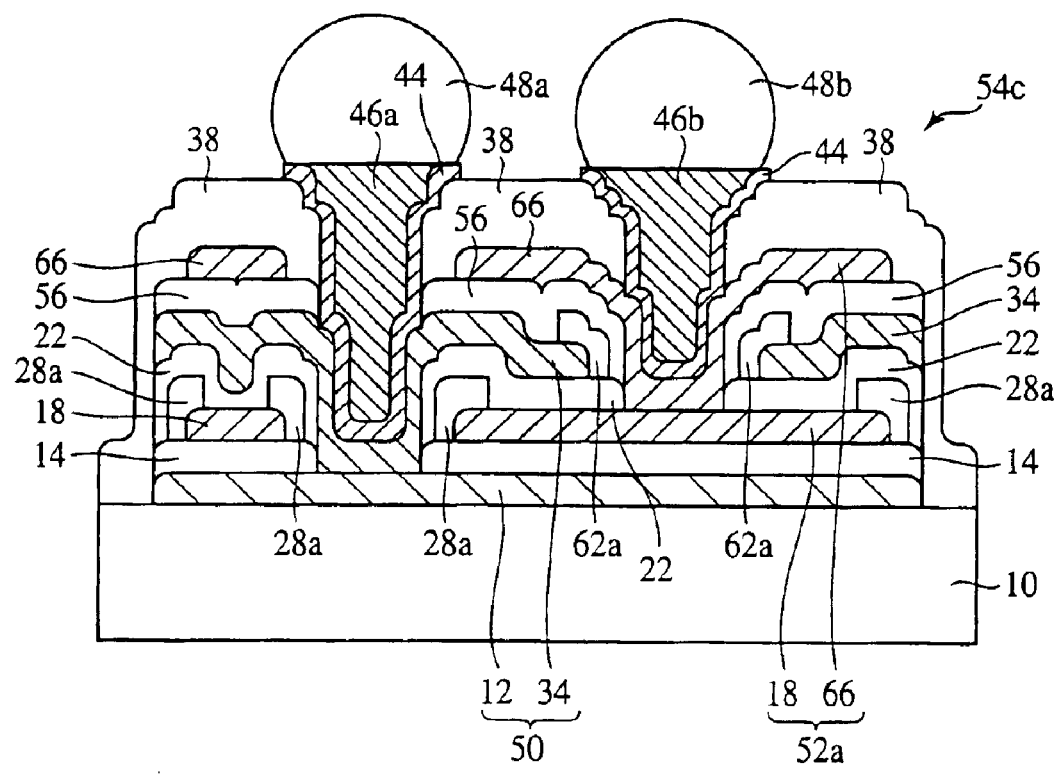
FIG. 12 is a sectional view of the capacitor according to a modification of the third embodiment of the present invention.

Next, a modification of the capacitor according to the present embodiment will be explained with reference to FIG. 12. FIG. 12 is a sectional view of the capacitor according to the present modification.

The capacitor 54c according to the present modification is characterized mainly in that an insulation film 28a is formed between a conducting film 18 and a dielectric film 22, covering the edge of a conducting film 18, and an insulation film 62a is formed between a conducting film 34 and a dielectric film 56, covering the edge of the conducing film 34.

As described above, according to the present modification, even in a case that the insulation film 28a is formed between the conducting film 18 and the dielectric film 22, and the insulation film 62a is formed between the conducting film 34 and the dielectric film 56, the capacitor can have larger capacitance, as does the capacitor shown in FIG. 11.

A Fourth Embodiment

Figure 13:
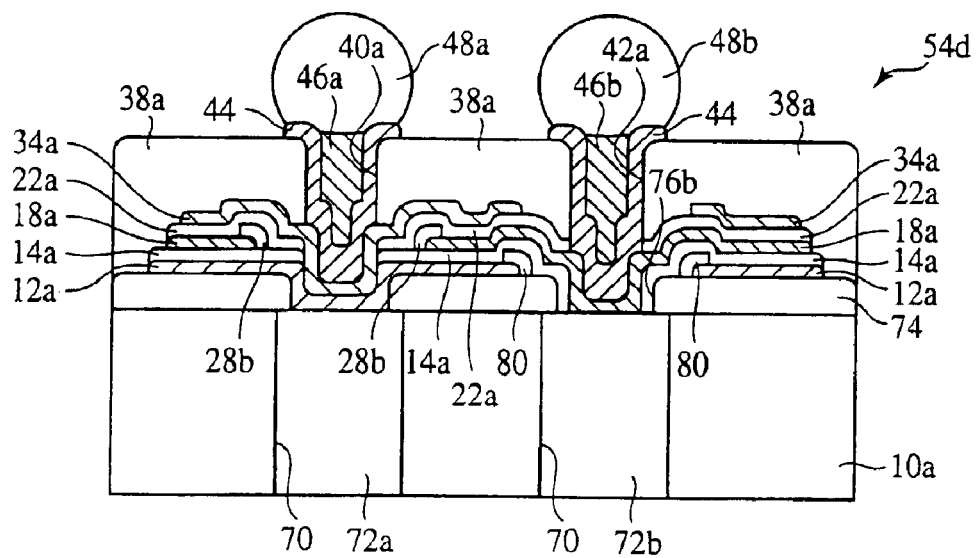
FIG. 13 is a sectional view of the capacitor according to a fourth embodiment of the present invention.
Figure 14:
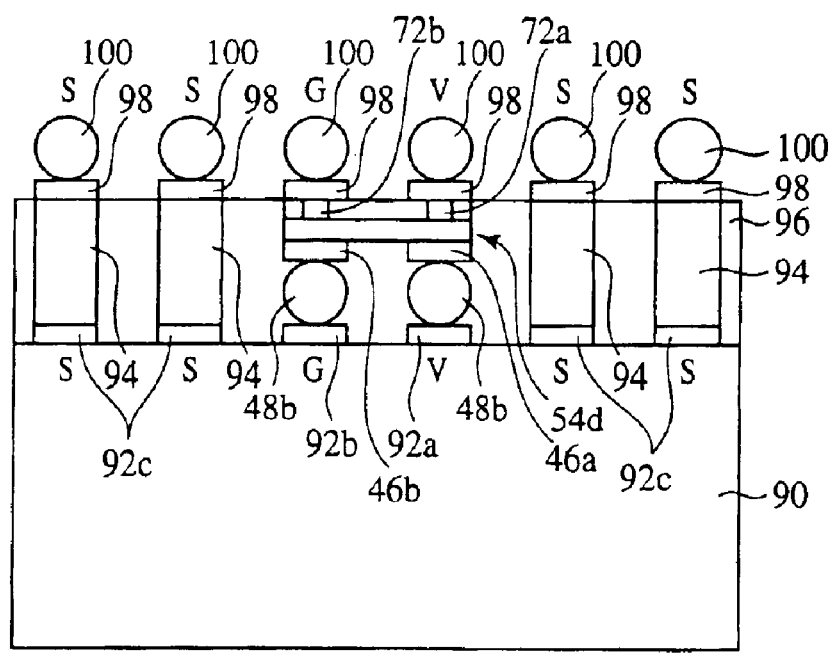
FIG. 14 is a diagrammatic view of the semiconductor device according to a fourth embodiment of the present invention.

The capacitor according to a fourth embodiment of the present invention and a method for fabricating the capacitor will be explained with reference to FIGS. 13 and 14. FIG. 13 is a sectional view of the capacitor according to the present embodiment. FIG. 14 is a sectional view of the semiconductor device according to the present embodiment. The same members of the present embodiment as those of the capacitor according to the first to the third embodiments and the method for fabricating the capacitor, shown in FIGS. 1 to 12 are represented by the same reference numbers not to repeat or to simplify their explanation.

(Capacitor)

The capacitor 54d according to the present embodiment will be explained with reference to FIG. 13.

Via holes 70 are formed in a silicon substrate 10a, passed through the silicon substrate 10a from the upper surface to the backside.

Vias 72a, 72b of, e.g., Cu are buried in the via hole 70. The via 72a is electrically connected to, e.g., electric source lines (not shown), and the via 72b is electrically connected to, e.g., ground lines (not shown).

An insulation film 74 of silicon dioxide is formed on a silicon substrate 10a. In the insulation film 74, openings 76a, 76b are formed down to the via 72a, 72b.

A conducting film 12a of a 200 nm-thickness Pt film is formed on the insulation film 74. The conducting film 12a is connected to the via 72a through the opening 76a.

An insulation film 80 of a 200 nm-thickness silicon dioxide film is formed, covering the edge of the conducting film 12a.

A dielectric film 14a of a 200 nm-thickness BST film is formed on the conducting film 12a. The dielectric film 14a is formed, covering the insulation film 80.

On the dielectric film 14a, a conducting film 18a of a 200 nm-thickness Pt film is formed. The conducting film 18a is connected to the via 72b.

An insulation film 28b of a 200 nm-thickness silicon oxide film is formed, covering the edge of the conducting film 18a.

On the conducting film 18a, a dielectric film 22a of a 200 nm-thickness BST film is formed. The dielectric film 22a is formed, covering the insulation film 28b.

On the dielectric film 22a, a conducting film 34a of a 200 nm-thickness Pt film is formed. The conducting film 34a is connected to the conducting film 12a.

A passivation film 38a of a 1 μm-thickness polyimide film is formed on the entire surface.

In the passivation film 38a, a contact hole 40a and a contact hole 42a are formed respectively down to the conducting film 34a and the conducting film 18a. A conducting film 44 is formed on the inside surfaces of the contact holes 40a, 42a.

Conductor plugs 46a, 46b are buried respectively in the contact hole 40a, 42a with the conducting film 44 formed on the inside surfaces. Solder bumps 48a, 48b are formed respectively on the conductor plugs 46a, 46b.

Thus, the capacitor 54d according to the present embodiment is formed.

(Semiconductor Device)

Next, the semiconductor device according to the present embodiment will be explained with reference to FIG. 14. FIG. 14 shows major constituent members alone so as to simplify the explanation.

The semiconductor device according to the present embodiment is characterized in that the capacitor 54d is mounted on an LSI 90.

As shown in FIG. 14, electrodes 92a, 92b, 92c are formed on the surface of the LSI 90 with semiconductor elements (not shown), such as transistors, etc. formed on. The electrode 92a is electrically connected to the electric source (V) lines (not shown) of the LSI 90. The electrode 92b is electrically connected to the ground (G) lines (not shown) of the LSI 90. The electrode 92c is electrically connected to the signal (S) lines (not shown) of the LSI 90. The capacitor 54d according to the present embodiment is mounted on the electrodes 92a, 92b.

Column-shaped vias 94 of Cu are formed on the electrodes 92c.

The vias 94 and the capacitor 54d are buried in an epoxy-group resin 96. The upper surface of the vias 94 and the surfaces of the vias 72a, 72b of the capacitor 54d are exposed on the surface of the resin 96.

Electrodes 98 are formed on the vias 94 and the vias 72a, 72b.

Solder bumps 100 of, e.g., 96.5% Sn–3.5% Ag are formed on the electrodes 98.

Thus, the semiconductor device according to the present embodiment has such structure.

The semiconductor device according to the present embodiment, having such structure can be mounted on a circuit wiring substrate (not shown) through the solder bumps 100.

As described above, according to the present embodiment, the capacitor 54d is mounted directly on the LSI 90, whereby high frequency noises of the power source, etc. can be removed immediately near the LSI. Thus, according to the present embodiment, the semiconductor device can have higher reliability.

A Fifth Embodiment

Figures 15A, 15B, 15C:
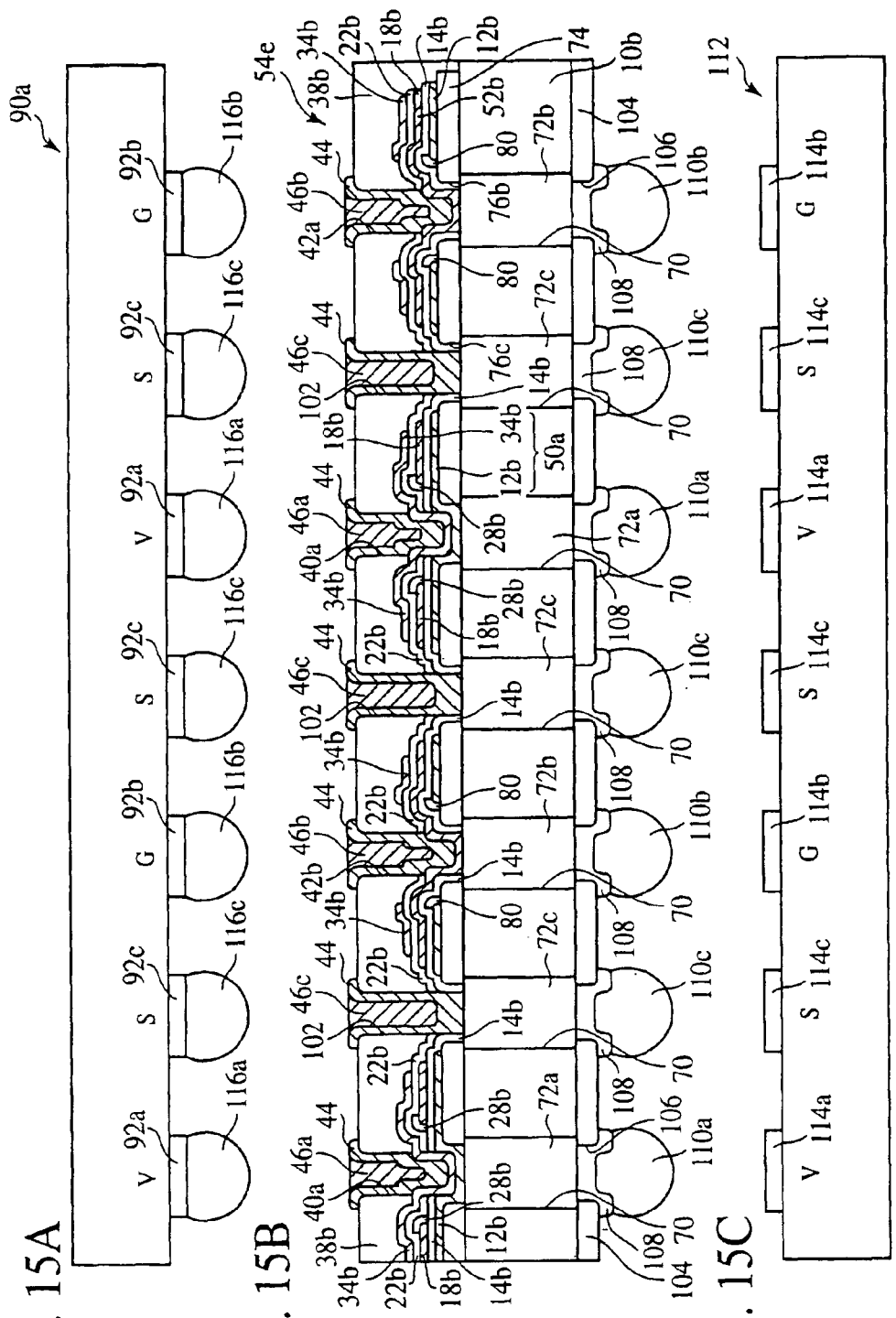
FIG. 15A is a sectional view of the LSI used in the integrated circuit according to a fifth embodiment of the present invention.
FIG. 15B is a sectional view of the capacitor used in the integrated circuit according to a fifth embodiment of the present invention.
FIG. 15C is a sectional view of the circuit wiring substrate used in the integrated circuit according to a fifth embodiment of the present invention.
Figure 16:
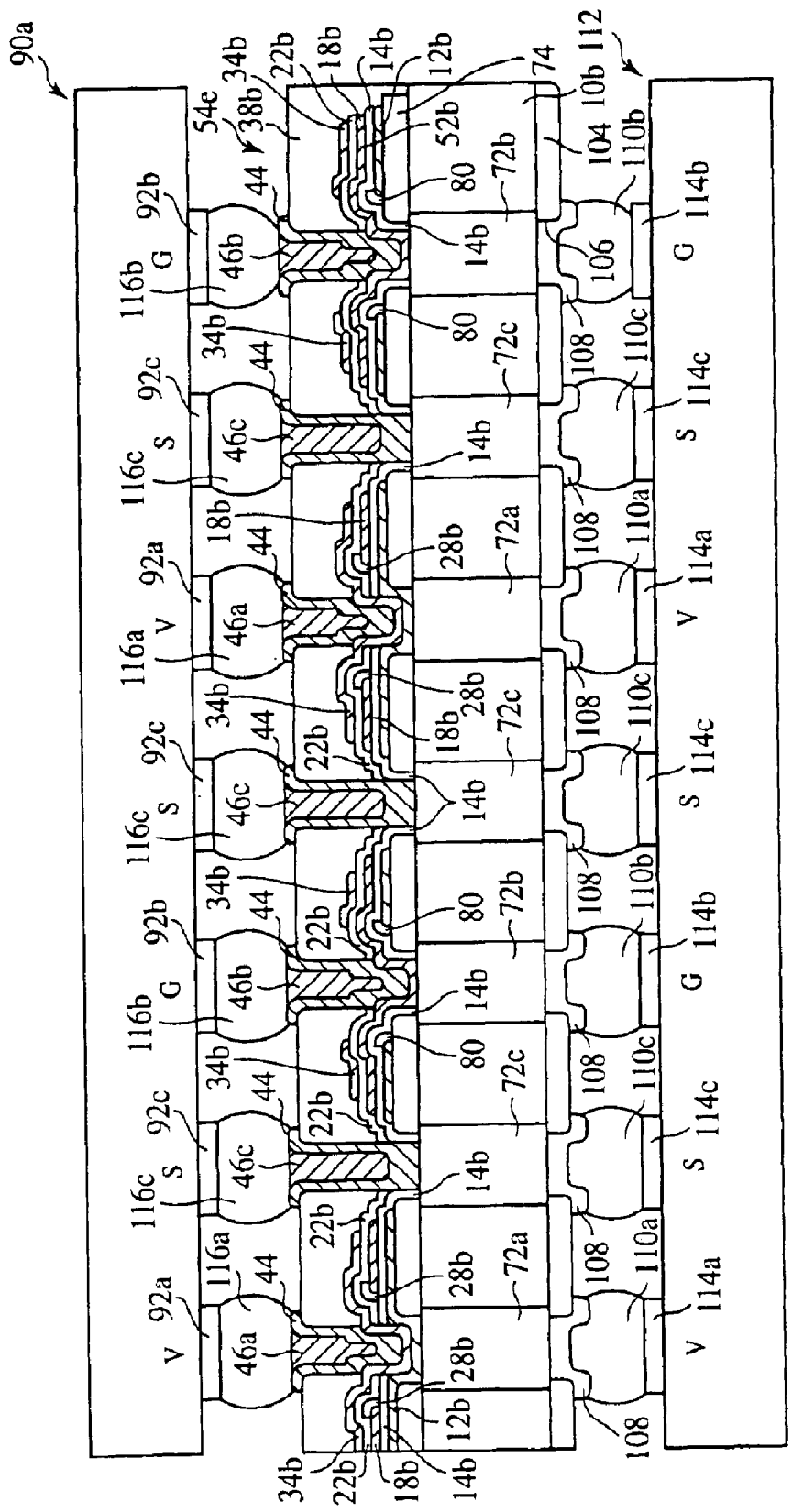
FIG. 16 is a sectional view of the integrated circuit according to the fifth embodiment of the present invention.

The capacitor according to a fifth embodiment of the present invention and an integrated circuit device using the capacitor will be explained with reference to FIGS. 15A to 16. FIGS. 15A to 15C are sectional views of an LSI, a capacitor and a circuit wiring substrate. FIG. 15A is a sectional view of the LSI used in the present embodiment. FIG. 15B is a sectional view of the capacitor used in the present embodiment. FIG. 15C is a sectional view of the circuit wiring substrate used in the present embodiment. FIG. 16 is a sectional view of the integrated circuit device according to the present embodiment. The same members of the present embodiment as those of the capacitor and the method for fabricating the capacitor, etc. shown in FIGS. 1 to 14 are represented by the same reference numbers not to repeat or to simplify their explanation.

(LSI)

The LSI used in the present embodiment will be explained with reference to FIG. 15A.

Semiconductor elements (not shown) are formed in the LSI 90a. Electrodes 92a to 92c are formed on the backside of the LSI 90a.

The electrodes 92a are electrically connected to the electric power source lines (not shown). The electrodes 92b are electrically connected to the ground lines (not shown). The electrodes 92c are electrically connected to the signal lines (not shown).

Solder bumps 116a to 116c of, e.g., 96.5% Sn–3.5% Ag are formed respectively on the backsides of the electrodes 92a to 92c.

Thus, the LSI 90a used in the present embodiment has such structure.

(Capacitor)

Then, the capacitor according to the present embodiment will be explained with reference to FIG. 15B.

As shown in FIG. 15B, via holes 70 are formed in a silicon substrate 10b passed from the upper surface to the backside.

Vias 72a to 72c of, e.g., Cu are buried in the via holes 70.

An insulation film 74 of silicon dioxide is formed on a silicon substrate 10b. Openings 76a to 76c are formed in the insulation film 74 down to the vias 72a to 72c.

A conducting film 12b of a 200 nm-thickness Pt film is formed on the insulation film 74. The conducting film 12b is connected to the via 72a through the opening 76a.

An insulation film 80 of silicon dioxide is formed, covering the edge of the conducting film 12b.

A dielectric film 14b of a 200 nm-thickness BST is formed on the conducting film 12b. The dielectric film 14b is formed, covering the insulation film 80.

On the dielectric film 14b, a conducting film 18b of a 200 nm-thickness Pt film is formed. The conducting film 18b is connected to the via 72b.

An insulation film 28b of silicon dioxide is formed, covering the edge of the conducting film 18b.

On the conducting film 18b, a dielectric film 22b of a 200 nm-thickness BST is formed. The dielectric film 22b is formed, covering the insulation film 28b.

A conducting film 34b of a 200 nm-thickness Pt film is formed on the dielectric film 22b. The conducting film 34b is connected to the conducting film 12b.

A passivation film 38b of a 1 $\mu$m-thickness polyimide is formed on the entire surface.

In the passivation film 38b, a contact hole 40a, a contact hole 42a and a contact hole 102 are formed respectively down to the conducting film 34b, the conducting film 18b and the via 72c. A conducting film 44 of Pt is formed on the inside surfaces of the contact holes 40a, 42a, 102.

Conductor plugs 46a, 46b, 46c of Pt are buried in the contact holes 40a, 42a, 102 with the conductor film 44 formed on the inside surfaces.

On the backside of the silicon substrate 10b, an insulation film 104 of silicon dioxide is formed. Openings 106 are formed in the insulation film 104 down to the vias 72a to 72c.

Electrodes 108 are formed on the backsides of the vias 72a to 72c, connected to the vias 72a to 72c through the openings 106.

Solder bumps 110a to 110c of, e.g., 96.5% Sn–3.5% Ag are formed on the backsides of the electrodes 108.

Thus, the capacitor 54e according to the present embodiment has such structure.

(Circuit Wiring Substrate)

Then, the circuit wiring substrate according to the present embodiment will be explained with reference to FIG. 15C.

As shown in FIG. 15C, electrodes 114a to 114c are formed on a circuit wiring substrate 112. The electrodes 114a are electrically connected to electric power source lines (not shown). The electrodes 114b are electrically connected to the ground lines (not shown). The electrodes 114c are electrically connected to signal lines (not shown).

Thus, the circuit wiring substrate 112 according to the present embodiment has such structure.

(Integrated Circuit Device)

The integrated circuit device according to the present embodiment will be explained with reference to FIG. 16.

As shown in FIG. 16, the capacitor 54e is mounted on the circuit wiring substrate 112.

An LSI 90a is mounted on the capacitor 54e.

Thus, the integrated circuit according to the present embodiment has such structure.

As described above, according to the present embodiment, the capacitor 54e is interposed between the circuit wiring substrate 112 and the LSI 90a, whereby the wiring of the feeder lines, specifically, the wiring of the electric power source lines and the ground lines can be short. Furthermore, according to the present embodiment, the conducting films 12b, 34b forming the first electrode 50a of the capacitor 54e have very large areas, and the conducting film 18b forming the second electrode 52b of the capacitor 54e has a very large area, whereby the capacitor can have very large capacitance. Thus, according to the present embodiment, the integrated circuit device can have very high reliability.

A Sixth Embodiment

Figure 17:
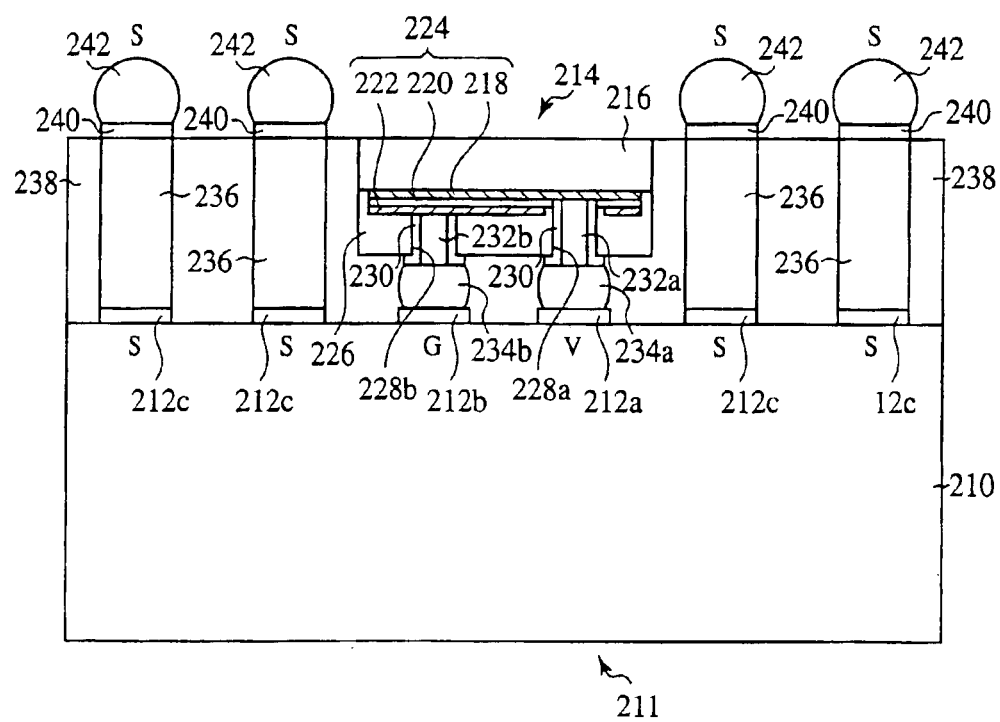
FIG. 17 is a sectional view of the semiconductor device according to a sixth embodiment of the present invention.

The semiconductor device according to a sixth embodiment of the present invention and the method for fabricating the semiconductor device will be explained with reference to FIGS. 17 to 24. FIG. 17 is a sectional view of the semiconductor device according to the present embodiment. FIGS. 18A to 24 are sectional views of the semiconductor device according tot he present embodiment in the steps of the method for fabricating the semiconductor device, which explain the method. The same members of the present embodiment as those of the capacitor and the method for fabricating the capacitor, etc. shown in FIGS. 1 to 15C are represented by the same reference numbers not to repeat or to simplify their explanation.

(Semiconductor Device)

First, the semiconductor device according to the present embodiment will be explained with reference to FIG. 17.

As shown in FIG. 17, on a semiconductor substrate 210 of silicon, transistors, electric power source (V) lines, ground (G) lines, signal (S) lines, etc. (not shown) are formed. Thus, the semiconductor element substrate has such structure.

In the present specification, the "semiconductor element substrate" means a substrate which comprises a semiconductor substrate and a semiconductor element formed on the semiconductor substrate.

Electrodes 212a to 212c of Au are formed on the semiconductor substrate 210. The electrode 212a is electrically connected to the electric power source (V) lines formed on the semiconductor substrate 210. The electrode 212b is electrically connected to the ground (G) lines. The electrodes 212c are electrically connected to the signal (S) lines. Thus, the LSI 211 has such structure.

A capacitor 214 is flip chip bonded to the electrodes 212a, 212b.

Then, the capacitor 214 used in the present embodiment will be explained.

An electrode 218 of a 200 nm-thickness Pt film is formed on the backside of a silicon substrate 216 which is a support base.

On the backside of the electrode 218, a dielectric film 220 of a 200 nm-thickness BST (Ba, Sr)TiO$_3$) is formed. A composition of the BST can be, e.g., Ba$_{0.5}$Sr$_{0.5}$TiO$_3$.

On the backside of the dielectric film 220, an electrode 222 of a 200 nm-thickness Au film is formed.

The electrode 218, the dielectric film 220 and the electrode 222 form the capacitor 224.

Further on the entire surface, a passivation film 226 of a 1 µm-thickness polyimide film is formed. In the passivation film 226, a contact hole 228a and a contact hole 228b are formed respectively down to the electrode 218 and the electrode 222.

A conducting film 230 of a Cr film and an Ni film laid the latter on the former is formed on the inside surfaces of the contact holes 228a, 228b. The Cr film and the Ni film forming the dielectric film 230 can be formed by, e.g., sputtering.

Conductor plugs 232a, 232b of an Ni film and an Au film laid the latter on the former are buried respectively in the contact holes 228a, 228b with the conductor film 230 formed on the inside surfaces. The Ni film and the Au film forming the conductor plugs 232a, 232b can be formed by, e.g., plating.

Solder bumps 234a, 234b of Sn—Ag are formed respectively on the backsides of the conductor plugs 232a, 232b.

Thus, the capacitor 214 used in the present embodiment has such structure.

The electrode 218 of the capacitor 214 is electrically connected to the source (V) lines of the LSI 211 through the conductor plug 232a, the solder bump 234a and the electrode 212a. The electrode 222 of the LSI 211 is electrically connected to the ground (G) lines of the LSI 211 through the conductor plug 232b and the solder bump 234b and the electrode 212b.

Vias 236 which are conductors each in the shape of a 70 µm-diameter and a 160 µm-height column-shaped are formed on the electrodes 212c.

The vias 236 and the capacitor 214 are buried in an insulation film 238 of an epoxy group resin. The insulation layer 238 and the silicon substrate 216 of the capacitor 214 are polished until the upper surfaces of the vias 236 are exposed. Thus, the upper surface of the capacitor 214, the upper surfaces of the vias 236 and the upper surface of the insulation layer 238 are flush with each other.

On the vias 236, electrodes 240 are formed of a 2 µm-thickness Ni film and a 1 µm-thickness Au film laid the latter on the former.

Solder bumps 242 of Sn—Ag are formed on the electrodes 240.

Thus, the semiconductor device according to the present embodiment has such structure.

The semiconductor device according to the present embodiment can be mounted on, e.g., a circuit wiring substrate (not shown) through the solder bumps 242.

The semiconductor device according to the present embodiment is characterized mainly in that the capacitor 214 is mounted directly on the electrodes 212a, 212b of the LSI 211, and the vias 236 which are flush with the upper surface of the capacitor 214 are formed on the electrodes 212c of the LSI 211.

According to the present embodiment, the capacitor 214 is mounted directly on the electrodes 212a, 212b of the LSI 211, whereby ESL (Equivalent Series Inductance) and ESR (Equivalent Series Resistance) between the LSI 211 and the capacitor 214 can be made very small. Thus, according to the present embodiment, source voltage variations can be effectively depressed, and high frequency noises of the electric power source can be effectively removed.

According to the present embodiment, the vias 236 which are flush with the upper surface of the capacitor 214 are formed on the electrodes 212c of the LSI 211, whereby the capacitor 214 does not hinder the flip chip bonding of the LSI 211 to circuit wiring substrate, etc.

According to the present embodiment, the dielectric film 220 of the capacitor 214 is formed of BST film, whose relative dielectric constant is high, whereby the capacitor 224 can be thin and can have large capacitance. According to the present embodiment, the silicon substrate 216 of the capacitor 214 is polished thin, whereby the present embodiment can satisfy the requirement of the down-sizing. According to the present embodiment, it is not necessary to dispose a decoupling capacitor separately from the LSI, whereby the requirement of higher density can be also satisfied.

Thus, the semiconductor device according to the present embodiment of the present invention can ensure stable operation in high-frequency region while satisfying the requirements of down-sizing and higher density.

(Method for Fabricating the Semiconductor Device)

Then, the method for fabricating the semiconductor device according to the present embodiment will be explained with reference to FIGS. 18A to 24.

Figure 18A:
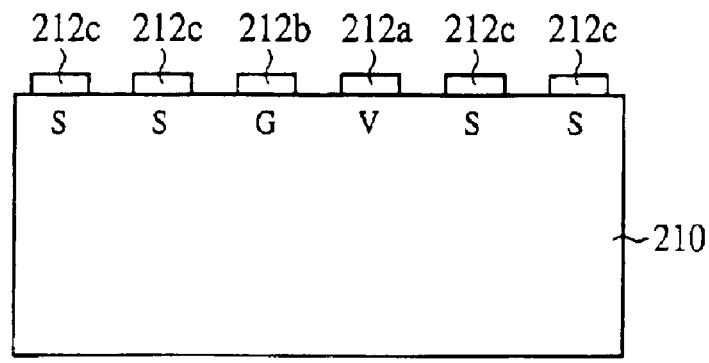
FIGS. 18A to 18C are sectional views of the semiconductor device according to the sixth embodiment of the present invention in the steps of the method for fabricating the semiconductor device, which explain the method (Part 1).

First, as shown in FIG. 18A, electrodes 212a to 212c of, e.g., Au are formed on a semiconductor wafer 210 with transistor, etc. (not shown) formed on.

Figure 18B:
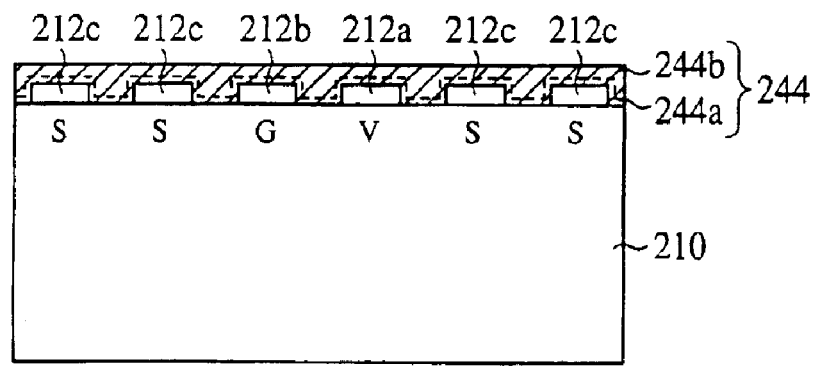

Then, as shown in FIG. 18B, a 50 nm-thickness Cr film 244a and a 500 nm-thickness Cu film 244b are sequentially formed the latter on the former by sputtering. Thus, a conducting film 244 is formed of the Cr film 244a and the Cu film 244b. The conducting film 244 functions as a plating electrode when a Cu layer 250 (see FIG. 19A) and a Cu layer 258 (see FIG. 20C) by electroplating.

Figure 18C:
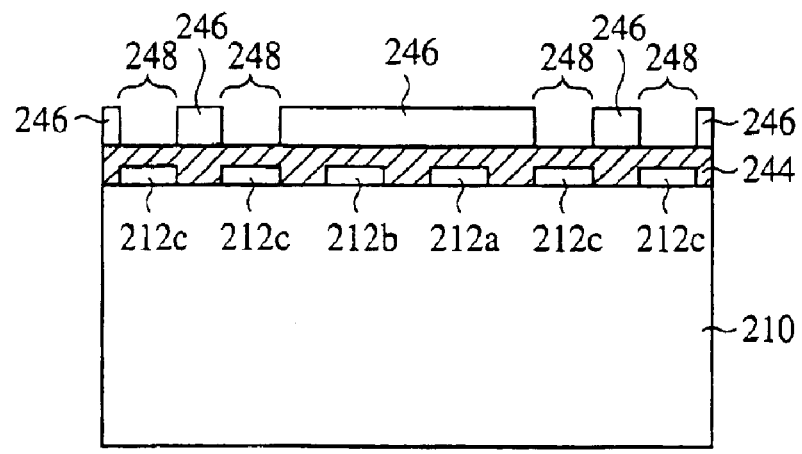

Then, a 50 $\mu$m-thickness dry film is applied to the entire surface. Furthermore, a 50 $\mu$m-thickness dry film resist is applied to the entire surface. Then, as shown in FIG. 18C, a resist film 246 of a 100 $\mu$m-total thickness is formed. By using the general liquid photoresist, only an about 20 $\mu$m-thickness resist film can be formed by once film forming. In the present embodiment, however, by using the thick dry film resist, the thick resist film 246 can be formed by the simple processing.

Then, the resist film 246 is patterned by photolithography. Thus, an opening 248 of, e.g., a 70 $\mu$m-diameter is formed in the resist film 246.

Figure 19A:
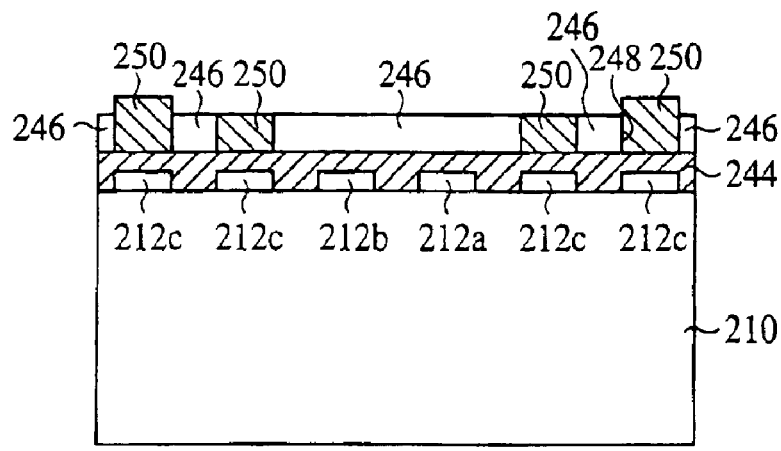
FIGS. 19A to 19C are sectional views of the semiconductor device according to the sixth embodiment of the present invention in the steps of the method for fabricating the semiconductor device, which explain the method (Part 2).

Next, as shown in FIG. 19A, a Cu film 250 is formed, by plating, on the conducting film 244 exposed in the opening 248 in the resist film 246. The Cu film 250 formed by plating has height deviations.

Figure 19B:
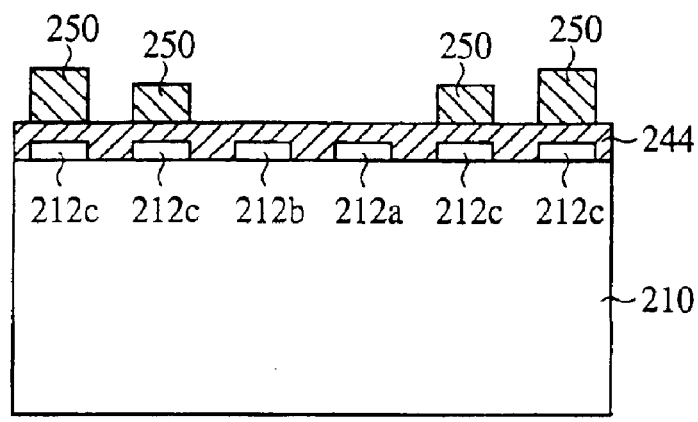

Next, as shown in FIG. 19B, the resist film 246 is removed.

Figure 19C:
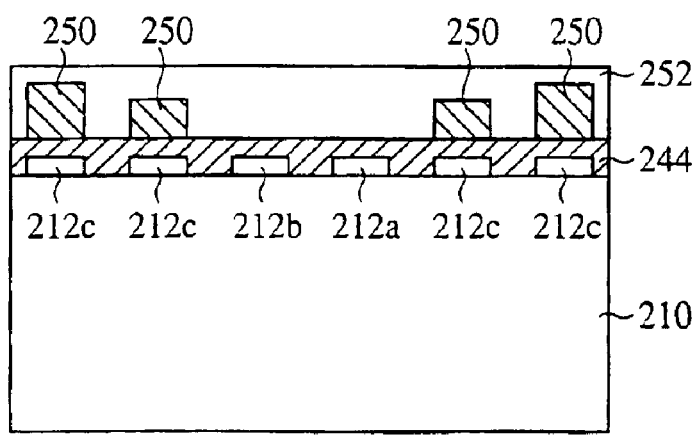

Then, as shown in FIG. 19C, a temporary seal layer 252 is formed of polyimide resin on the entire surface.

Figure 20A:
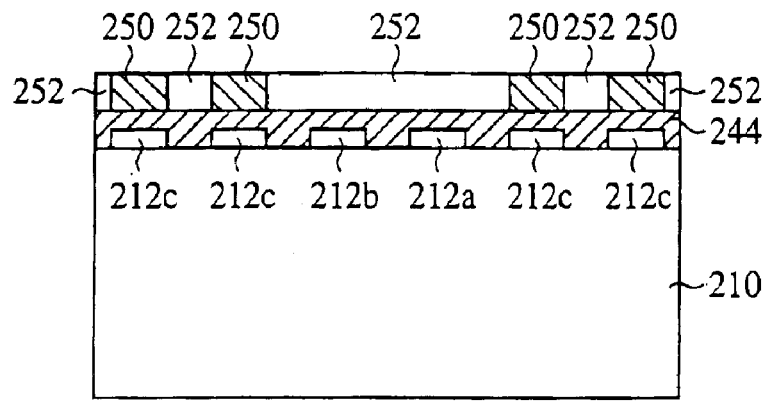
FIGS. 20A to 20C are sectional views of the semiconductor device according to the sixth embodiment of the present invention in the steps of the method for fabricating the semiconductor device, which explain the method (Part 3).

Then, as shown in FIG. 20A, the Cu layer 250 and the temporary seal layer 252 is polished by CMP (Chemical Mechanical Polishing) until all the upper surface of te Cu layer 250 is exposed. Thus, a height of the Cu layer 250 is evened to be, e.g., 80 $\mu$m.

Figure 20B:
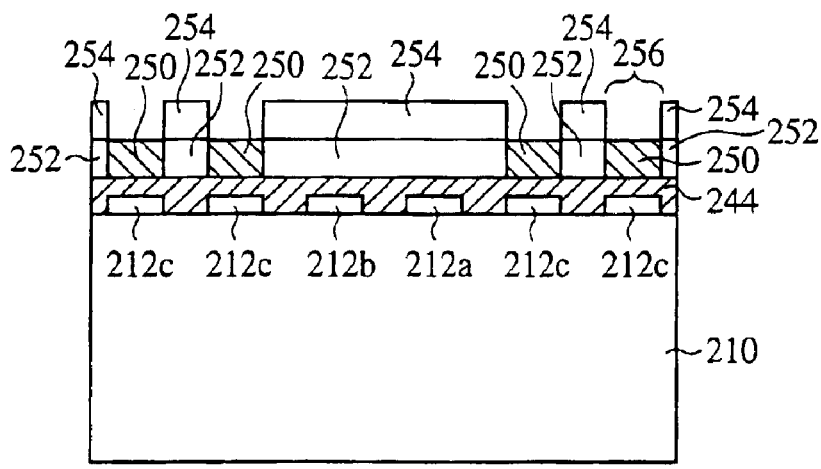

Then, a dry film is applied in the same way as described above to form a 100 $\mu$m-thickness resist film 254 as shown in FIG. 20B.

Next, the resist film 254 is patterned by photolithography. Thus, an opening 256 of, e.g., 70 $\mu$m-diameter opening 256 down to the Cu layer 250.

Figure 20C:
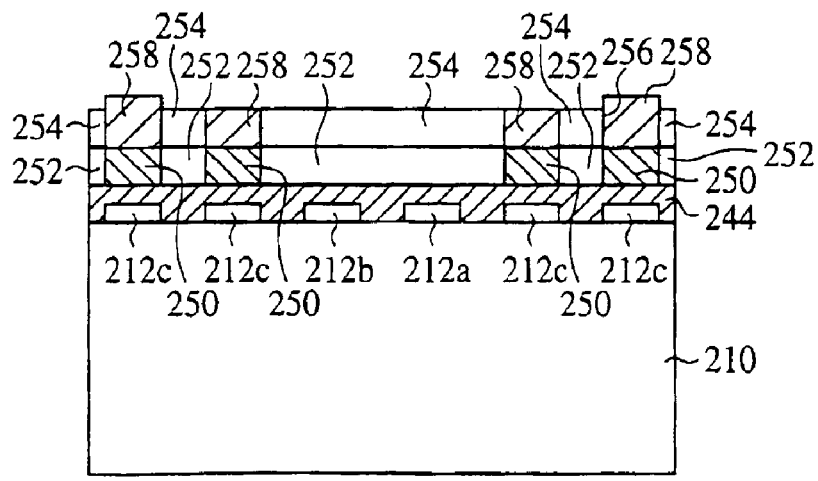

Then, as shown in FIG. 20C, a Cu layer 258 is formed on the Cu layer 250 in the opening 256 in the resist film 254 by plating. The Cu layer 258 formed by plating has height deviations.

Figure 21A:
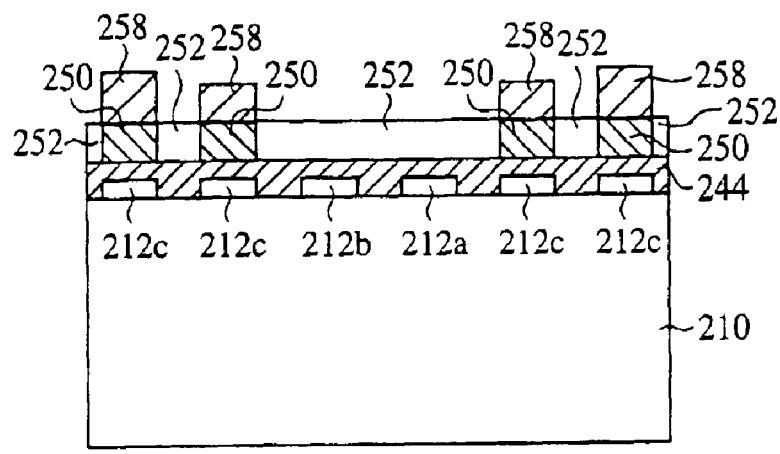
FIGS. 21A to 21C are sectional views of the semiconductor device according to the sixth embodiment of the present invention in the steps of the method for fabricating the semiconductor device, which explain the method (Part 4).

Next, as shown in FIG. 21A, the resist film 254 is removed.

Figure 21B:
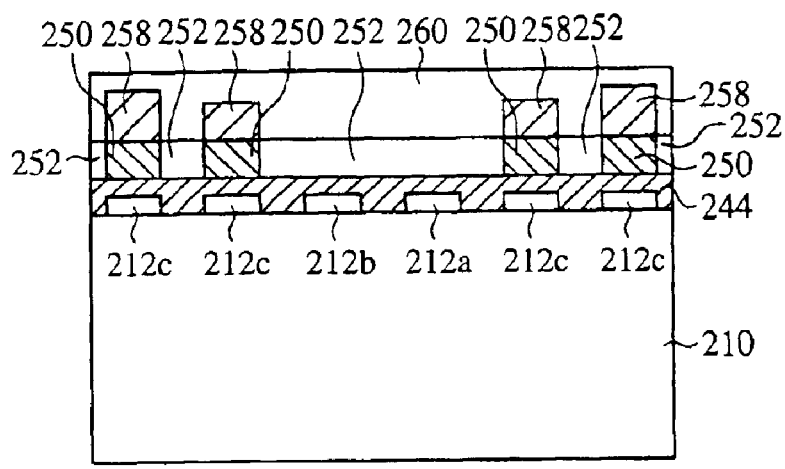

Next, as shown in FIG. 21B, a temporary sealing layer 260 is formed of polyimide resin on the entire surface.

Figure 21C:
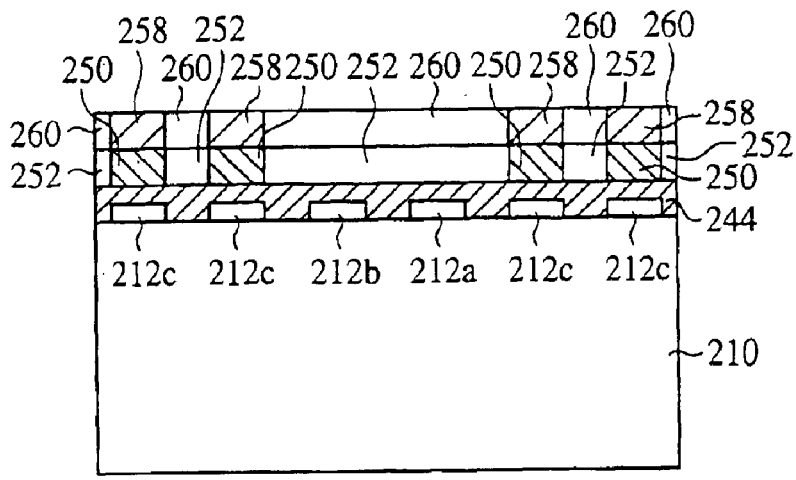

Then, as shown in FIG. 21C, the Cu layer 258 and the temporary seal layer 260 are polished by CMP until the entire upper surface of the Cu layer 258 is exposed. Then, a height of the Cu layer 258 is evened to be, e.g., 80 $\mu$m. A total height of the Cu layer 250 and the Cu layer 258 is, e.g., 160 $\mu$m.

Figure 22A:
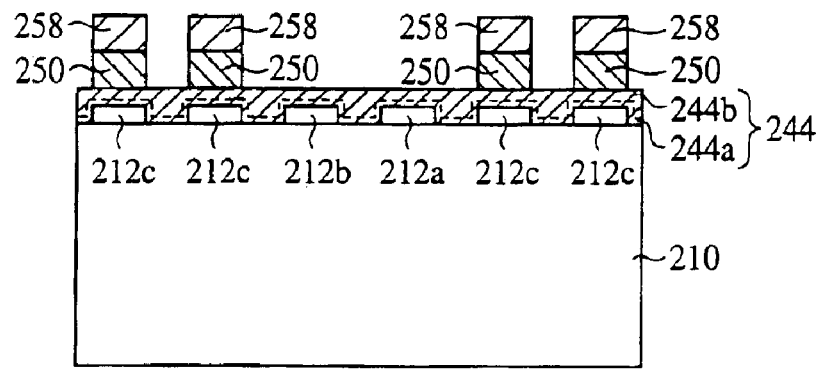
FIGS. 22A to 22C are sectional views of the semiconductor device according to the sixth embodiment of the present invention in the steps of the method for fabricating the semiconductor device, which explain the method (Part 5).

Then, as shown in FIG. 22A, the temporary seal layers 252, 260 of polyimide resin are removed by using an amine-based solvent.

Figure 22B:
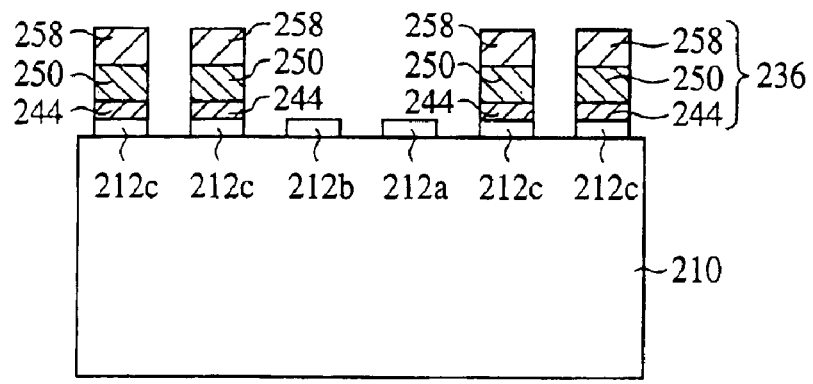

Next, as shown in FIG. 22B, the 500 nm-thickness Cu film 244b forming the conducting film 244 is wet-etched. In this etching, not only the Cu layer 224b but alos the Cu layers 250, 258 are etched, but the Cu layers 250, 258 have the surface etched only a little without any remarkable trouble because a diameter of the Cu layers 250, 258 is 70 $\mu$m, and a total height of the Cu layers 250, 258 is 160 $\mu$m, which are sufficiently larger than a 500 nm-film thickness of the Cu film 224b.

Then, the Cr film 244a forming the conducting film 244 is wet-etched. Thus, the conducting film 244, the Cu layer 250 and the Cu layer 258 form about 160 $\mu$m-height vias 236.

Figure 22C:
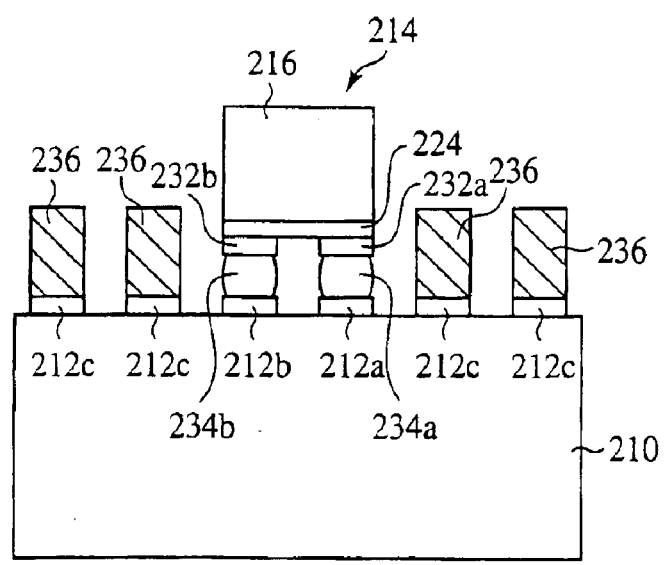

Next, as shown in FIG. 22C, the capacitor 214 is flip chip-bonded to the electrodes 212a, 212b. In FIGS. 22C to 23C, major constituent members alone of the capacitor 214 are schematically shown.

Figure 23A:
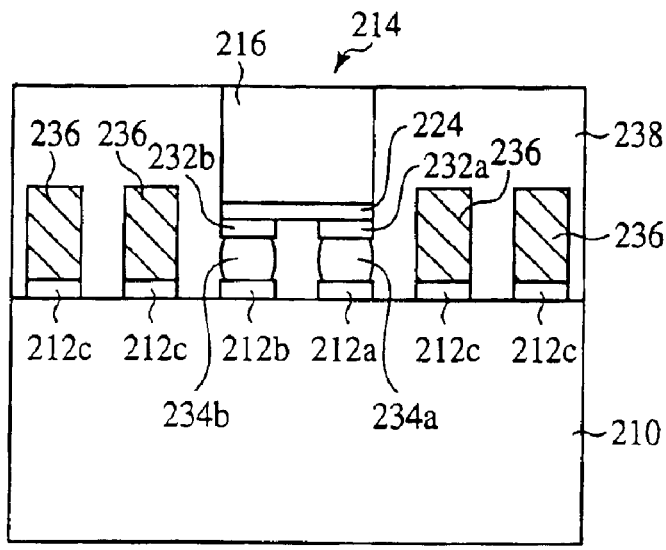
FIGS. 23A to 23C are sectional views of the semiconductor device according to the sixth embodiment of the present invention in the steps of the method for fabricating the semiconductor device, which explain the method (Part 6).

Then, as shown in FIG. 23A, an epoxy-group resin is applied to the entire surface. Then, the applied epoxy-group resin is solidified. Thus, an insulation film 238 of the epoxy-group resin is formed.

Figure 23B:
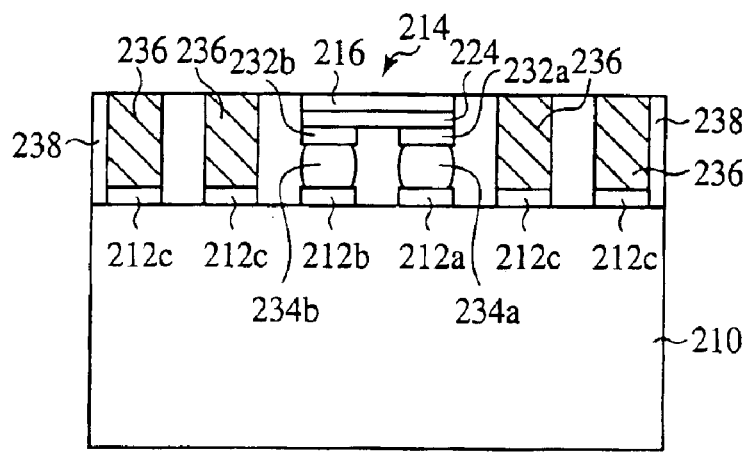

Next, as shown in FIG. 23B, the insulation film 238, is polished by CMP until the entire upper surfaces of the vias 236 are exposed. In polishing the insulation layer 238, the upper side of the silicon substrate 216 of the capacitor 214 is polished, but the capacitor part 224 formed on the backside of the silicon substrate 216 is not polished. This is because the solder bumps 234a, 234b have an about 60 $\mu$m-height, and a gap between the upper surfaces of the solder bumps 234a, 234b and the backside of the silicon substrate 216 is about 2 $\mu$m, whereby the backside of the silicon substrate 216 is sufficiently below the upper surface of the 160 $\mu$m-height vias 236.

Figure 23C:
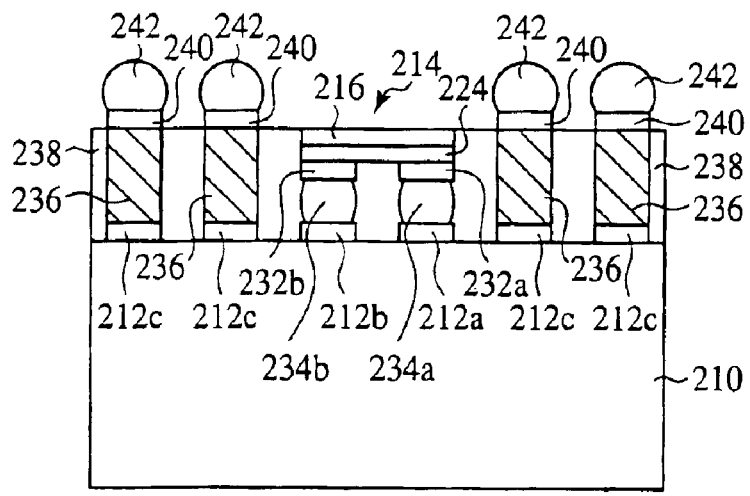

Then, as shown in FIG. 23C, a 2 $\mu$m-thickness Ni film and a 1 $\mu$m-thickness Au film are sequentially laid on the vias 236 to form electrodes 240.

Then, solder bumps 242 are formed of Sn—Ag on the electrodes 240.

Figure 24:
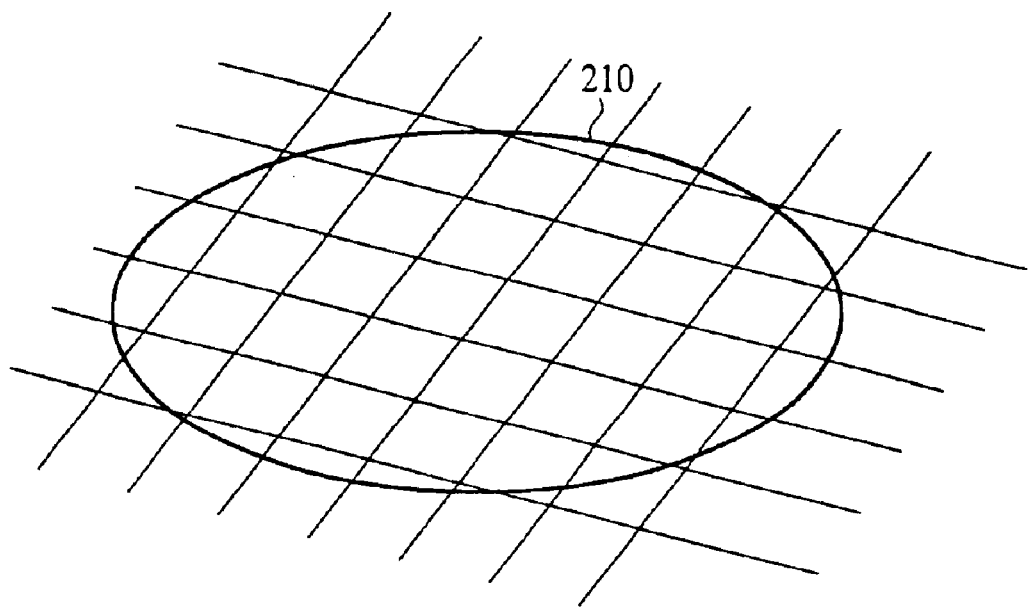
FIG. 24 is sectional views of the semiconductor device according to the sixth embodiment of the present invention in the steps of the method for fabricating the semiconductor device, which explain the method (Part 7).

Next, as shown in FIG. 24, the semiconductor wafer 210 is diced into chip sizes. The semiconductor device is fabricated on the stage of the wafer level and diced into chip sizes, whereby the semiconductor device can be fabricated with high throughputs.

Thus, the CSP (Chi Size Package)-type semiconductor device according to the present embodiment is fabricated.

The method for fabricating the semiconductor device according to the present embodiment is characterized mainly in polishing the insulation film 238 together with an upper side of the silicon substrate 216 after the capacitor 214 has been mounted. According to the present embodiment, an upper side of the silicon substrate is polished together with the insulation film 238, whereby a thickness of the silicon substrate 216 can be reduced without breaking the capacitor 214.

(Modification of the Semiconductor Device)

Figure 25:
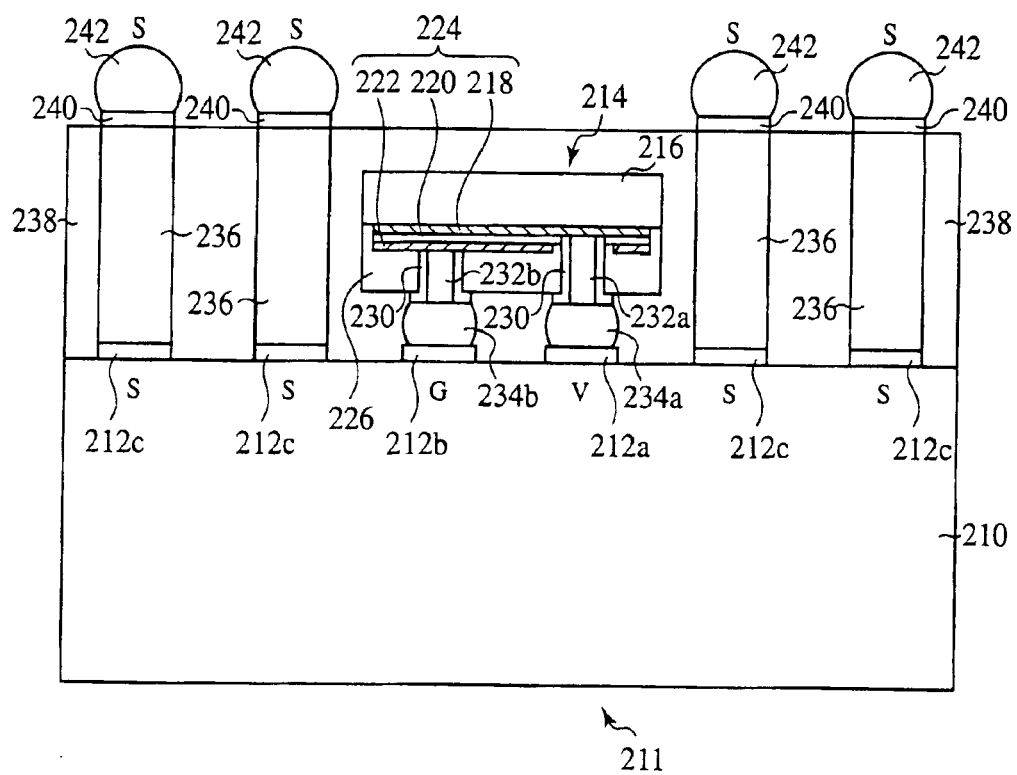
FIG. 25 is a sectional view of the semiconductor device according to a modification of the sixth embodiment of the present invention.

Next, a modification of the semiconductor device according to the present embodiment will be explained with reference to FIG. 25. FIG. 25 is a sectional view of the semiconductor device according to the present modification.

The semiconductor device according to the present modification is characterized mainly in that capacitor 214 has the upper surface covered with an insulation layer 238.

As shown in FIG. 25, the upper surface of the capacitor 214 is covered with the insulation film 238. The upper surfaces of vias 236 are exposed on the surface of the insulation film 238.

In the semiconductor device shown in FIG. 17, the upper surface of the capacitor 214 is exposed on the surface of the insulation film 238, but the upper surface of the capacitor 214 may be covered with the insulation film 238 as in the present modification.

A Seventh Embodiment

Figure 26:
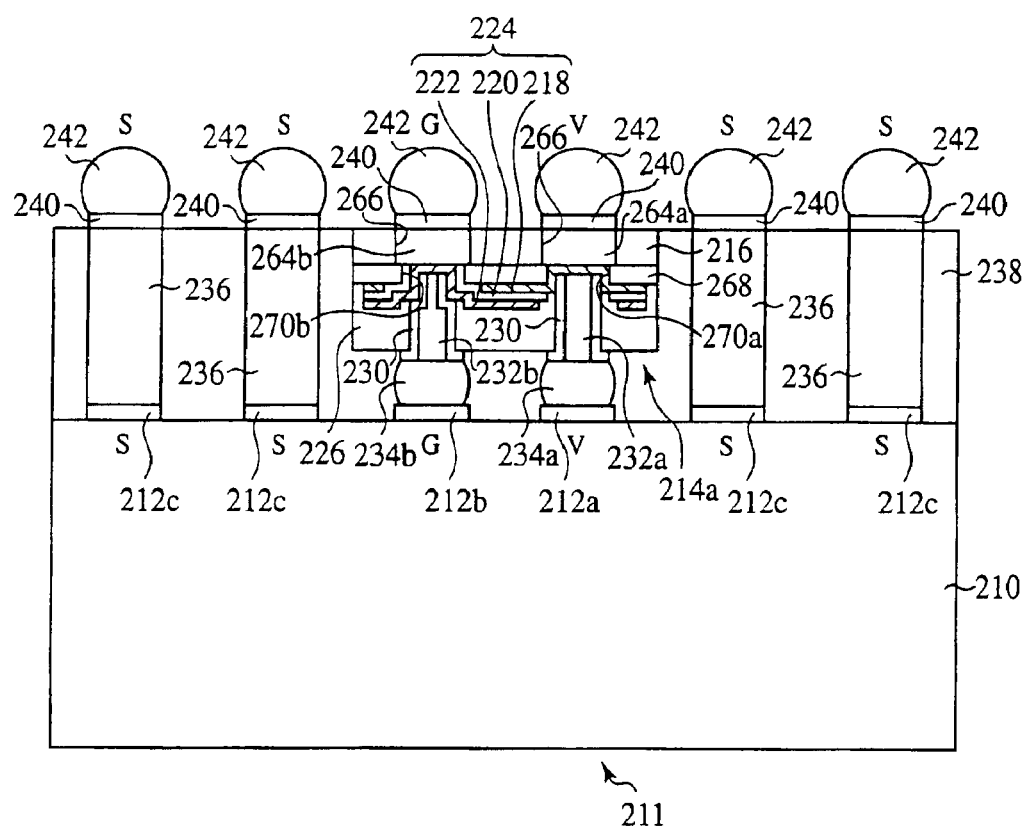
FIG. 26 is a sectional view of the semiconductor device according to a seventh embodiment of the present invention.

The semiconductor device according to a seventh embodiment of the present invention will be explained with reference to FIG. 26. FIG. 26 is a sectional view of the semiconductor device according to the present embodiment. The same members of the present embodiment as those of the semiconductor device according to the first to the sixth embodiment and the method for fabricating the semiconductor device, shown in FIGS. 1 to 15C are represented by the same reference numbers not to repeat or to simplify their explanation.

(Semiconductor Device)

Then, the semiconductor device according to the present embodiment will be explained with reference to FIG. 26.

The semiconductor device according to the present embodiment is characterized mainly in that vias holes 264a, 264b are formed through a silicon substrate 216 of a capacitor 214a, and electrodes 218, 222 forming the capacitor part 224 can be connected to the electric power source (V) lines and the ground (G) lines of a circuit wiring substrate (not shown) through vias 264a, 264b.

As shown in FIG. 26, the capacitor 214a is flip chip-bonded to electrodes 212a, 212b of an LSI 211.

Here, the capacitor 214a used in the present embodiment will be explained.

As shown in FIG. 26, the via holes 266 are formed through the silicon substrate 216. The via holes 266 can be formed by, e.g., high-density plasma etching.

The vias 264a, 264b of, e.g., Pt are buried in the via holes 266. The via 264a is electrically connected to the electric power source (V) lines (not shown) of, e.g., a circuit wiring substrate (not shown). The via 264b is electrically connected to the ground (G) lines of, e.g., the circuit wiring substrate (not shown). The vias 264a, 264b are formed by plating.

An insulation film 268 of silicon dioxide is formed on the backside of the silicon substrate 216. In the insulation film 268, openings 270a, 270b are formed respectively down to the vias 264a, 264b.

An electrode 218 a 200 nm-thickness Pt film is formed on the backside of the insulation film 268. The electrode 218 is electrically connected to the via 264a through the opening 270a.

On the backside of the electrode 218, a dielectric film 220 is formed of a 200 nm-thickness BST film.

On the backside of the dielectric film 220, an electrode 222 is formed of a 200 nm-thickness Au film. The electrode 222 is electrically connected to the via 264b through the opening 270b.

Thus, the capacitor used in the present embodiment has such structure.

As shown in FIG. 26, the upper surfaces of the vias 264a, 264b and the upper surfaces of vias 236 are exposed on the surface of the insulation film 238.

An electrode 240 of a 2 μm-thickness Ni film and a 1 μm-thickness Au film laid the latter of the former is formed on the vias 264a, 264b and the vias 236.

Solder bumps 242 of Sn—Ag are formed on the electrode 240.

As described above, according to the present embodiment, the vias 264a, 264b are formed through the silicon substrate 216 of the capacitor 214a, whereby the electrodes 218, 222 of the capacitor part 224 can be electrically connected to the electric power source (v) lines and the ground (G) lines of the circuit wiring substrate through the vias 264a, 264b. That is, according to the present embodiment, the capacitor part 224 can be connected directly to feed lines which feed source power to the LSI 211 from the cirucit wiring substrate, whereby voltage variations of the source power to be supplied to the LSI 211 can be effectively depressed, and high frequency noises of source power to be fed to the LSI 211 can be effectively removed.

(Modification 1)

Figure 27:
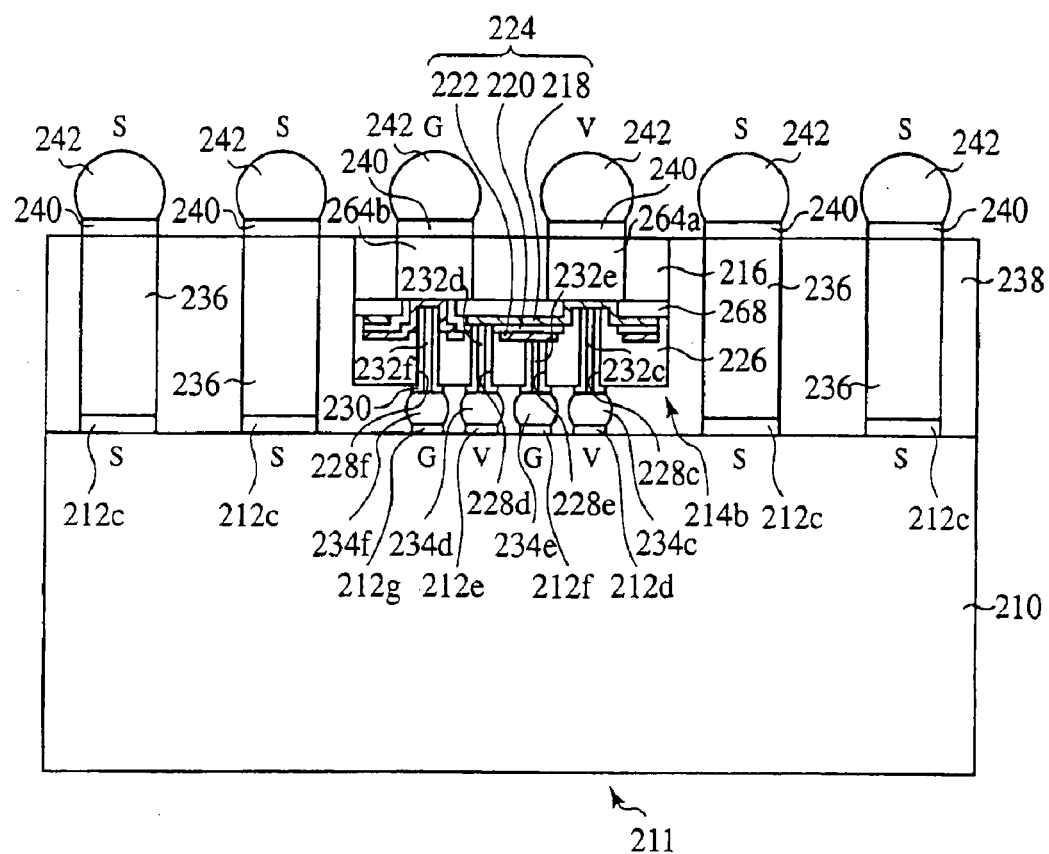
FIG. 27 is a sectional view of the semiconductor device according to Modification 1 of the seventh embodiment of the present invention.

Next, Modification 1 of the semiconductor device according to the present embodiment will be explained with reference to FIG. 27. FIG. 27 is a sectional view of the semiconductor device according to the present modification.

The semiconductor device according to the present modification is characterized mainly in that a capacitor 214b is mounted above electrodes 212d to 212g which are formed at a small pitch.

As shown in FIG. 27, electrodes 212d to 212g are formed on the LSI 211 at a smaller pitch than that of the electrodes 212c. A cross sectional shape of the electrodes 212d to 212g is smaller than that of the electrodes 212c.

The capacitor 214b is mounted on the electrodes 212d to 212g.

Here, the capacitor 214b used in the present modification will be explained.

In a passivation film 226, contact holes 228c, 228d and contact holes 228e, 228f are formed respectively down to the electrode 218 and down to the electrode 222.

A conducting film 230 of a Cr film and an Ni film the latter on the former is formed on the inside surfaces of the contact holes 228c to 228f.

Conductor plugs 232c to 232f are formed of an Ni film and an Au film laid the latter on the former respectively in the contact holes 228c to 228f with the conducting film 230 formed on the inside surfaces thereof.

Solder bumps 234c to 234f are formed of Sn—Ag respectively on the backsides of the conductor plugs 232c to 232f.

Thus, the capacitor 214b has such structure.

The electrode 218 of the capacitor 214b is electrically connected to the electric power source (V) lines of the LSI 211 through the conductor plug 232c, the solder bump 234c and the electrode 212d and is further electrically connected to the electric power source (V) lines of the LSI 211 through the conductor plug 232d, the solder bump 234d and the electrode 212e.

The electrode 222 of the capacitor 214b is electrically connected to the ground (G) lines of the LSI 211 through the conductor plug 232e, the solder bump 234e and the electrode 212f and is further electrically connected to the ground (G) lines of the LSI 211 through the conductor plug 232f, the solder bump 234f and the electrode 212g.

In the present modification, the electrodes 212d to 212g are formed at a small pitch, which allows a number of paths for connecting the LSI 211 to the electrodes 218, 222 to be larger. In the present modification, the electrodes 212d to 212f have a smaller cross sectional shape than the electrodes 212a, 212b, and accordingly a size of the solder bumps 234c to 234f is smaller than a size of the solder bumps 234a, 234b shown in FIG. 26, which makes a gap between the capacitor part 224 and the LSI 211 small. Thus, according to the present modification, an equivalent series resistance and equivalent series inductance between the LSI 211 and the capacitor part 224 can be small, and consequently voltage variations of the source power to be fed to the LSI 211 can be effectively depressed, and high frequency noises of the source power to be fed to the LSI 211 can be effectively removed.

(Modification 2)

Figure 28:
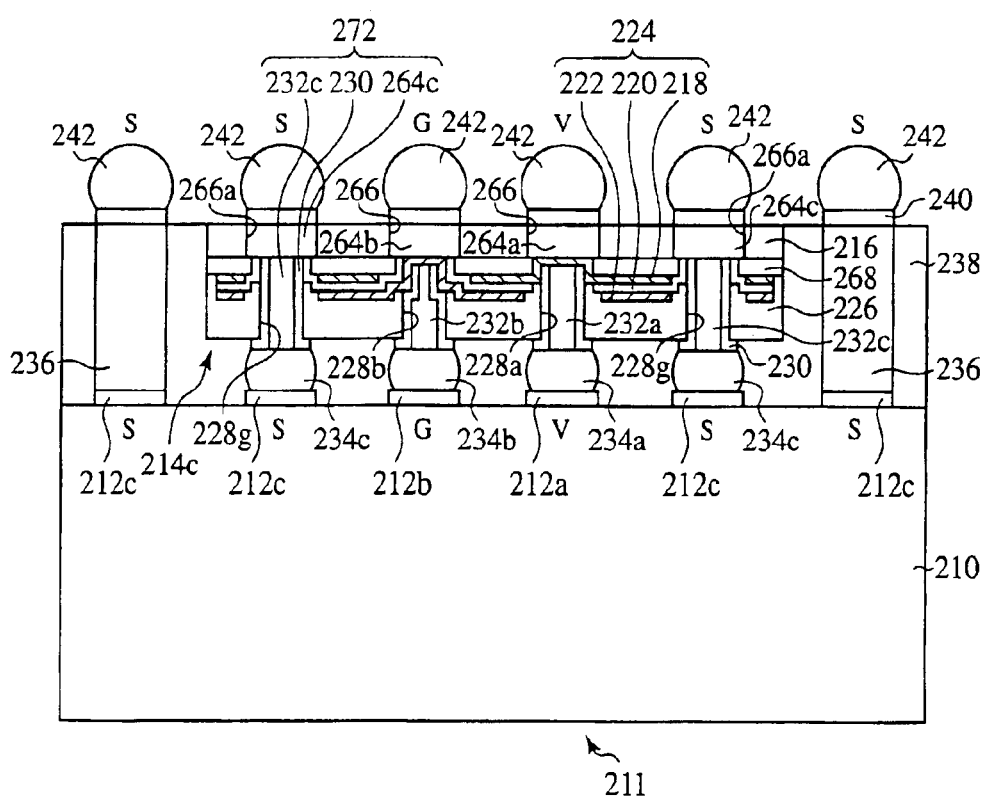
FIG. 28 is a cross sectional view of the semiconductor device according to Modification 2 of the seventh embodiment of the present invention.

Then, the semiconductor device according to Modification 2 of the present embodiment will be explained with reference to FIG. 28. FIG. 28 is a sectional view of the semiconductor device according to the present modification.

The semiconductor device according to the present modification is characterized mainly in that a through-electrode 272 for interconnecting signal (S) lines of an LSI 211 and signal (S) lines of a circuit wiring substrate (not shown) is formed in a capacitor 214c.

As shown in FIG. 28, the capacitor 214c is flip chip-bonded to electrodes 212a to 212c.

Here, the capacitor 214c used in the present modification will be explained.

Via holes 266a are formed through a silicon substrate 216. Vias 264c of, e.g. Pt are buried in the via holes 266a. The vias 264c are electrically connected to signal (S) lines (not shown) of, e.g., a circuit wiring substrate (not shown).

Contact holes 228g are formed in a passivation film 226 down to the vias 264c. A conducting film 230 is formed on the inside surfaces of the contact holes 228g.

Conductor plugs 232c of an Ni film and an Au film laid the later on the former are formed in the contact holes 282g with the conducting film 230 formed on the inside surfaces thereof.

The vias 264c, the conducting film 230 and the conductor plug 232c form the through-electrode 272. The through-electrode 272 is insulated from the electrodes 218, 222 forming the capacitor part 224.

Solder bumps 234c of Sn—Ag are formed on the backsides of the conductor plug 232c.

The capacitor 214c used in the present modification has such structure.

According to the present modification, a large area can be ensured for the capacitor part 224, whereby larger capacitance can be ensured. Furthermore, signal (S) lines of the LSI 211 can be connected to signal (S) lines of the circuit wiring substrate through the through-electrode 272, whereby connection of the signal lines is not deteriorated by the capacitor. Thus, according to the present modification, the capacitor can have large capacitance without deteriorating connection of the signal lines.

According to the present modification, the capacitor can have large capacitance, whereby voltage variations of the source power to be fed to the LSI 211 can be effectively depressed, and high frequency noises of the source power to be fed to the LSI 211 can be effectively removed.

An Eighth Embodiment

Figure 29:
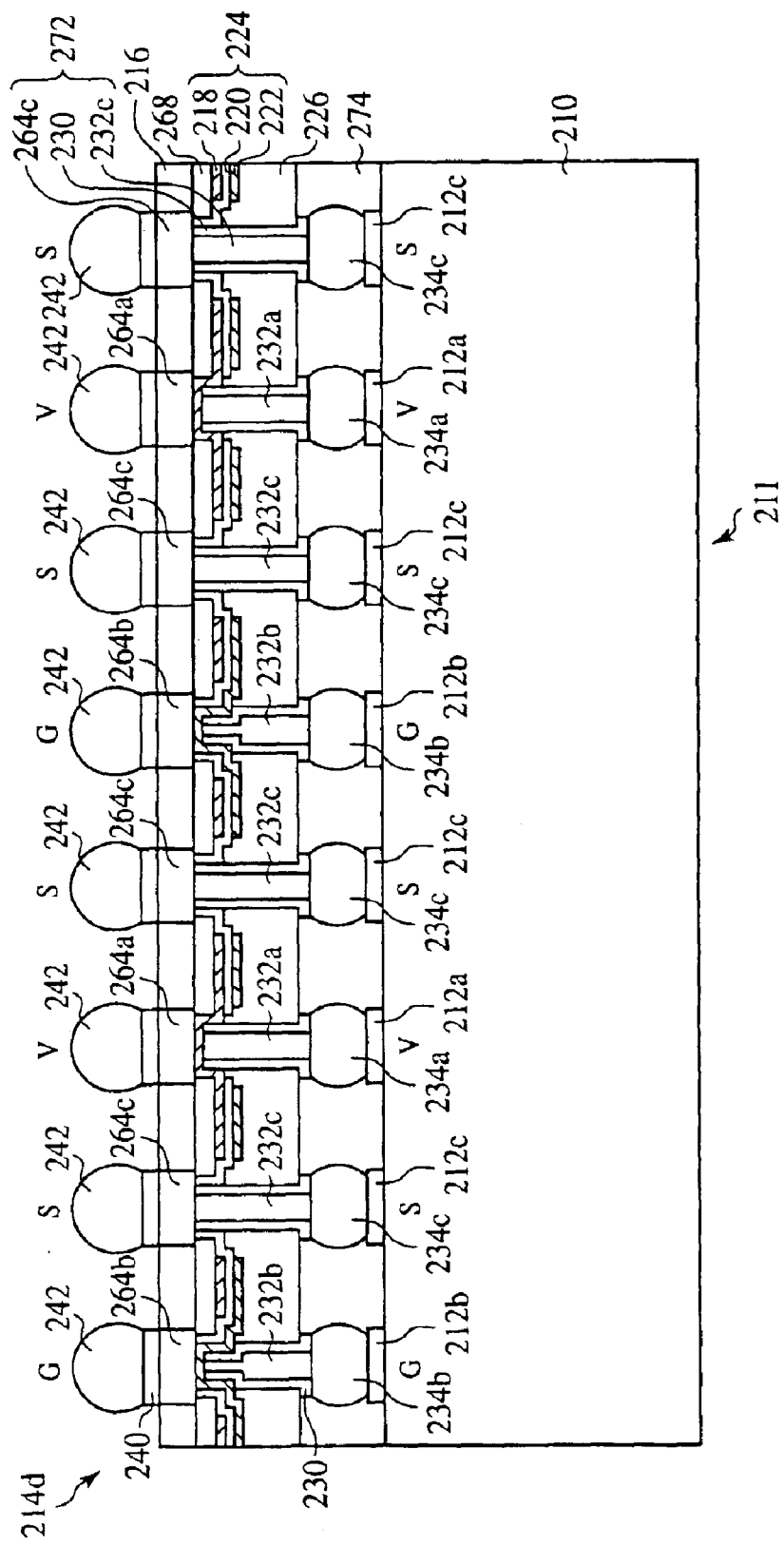
FIG. 29 is a sectional view of the semiconductor device according to an eighth embodiment of the present invention.
Figure 30:
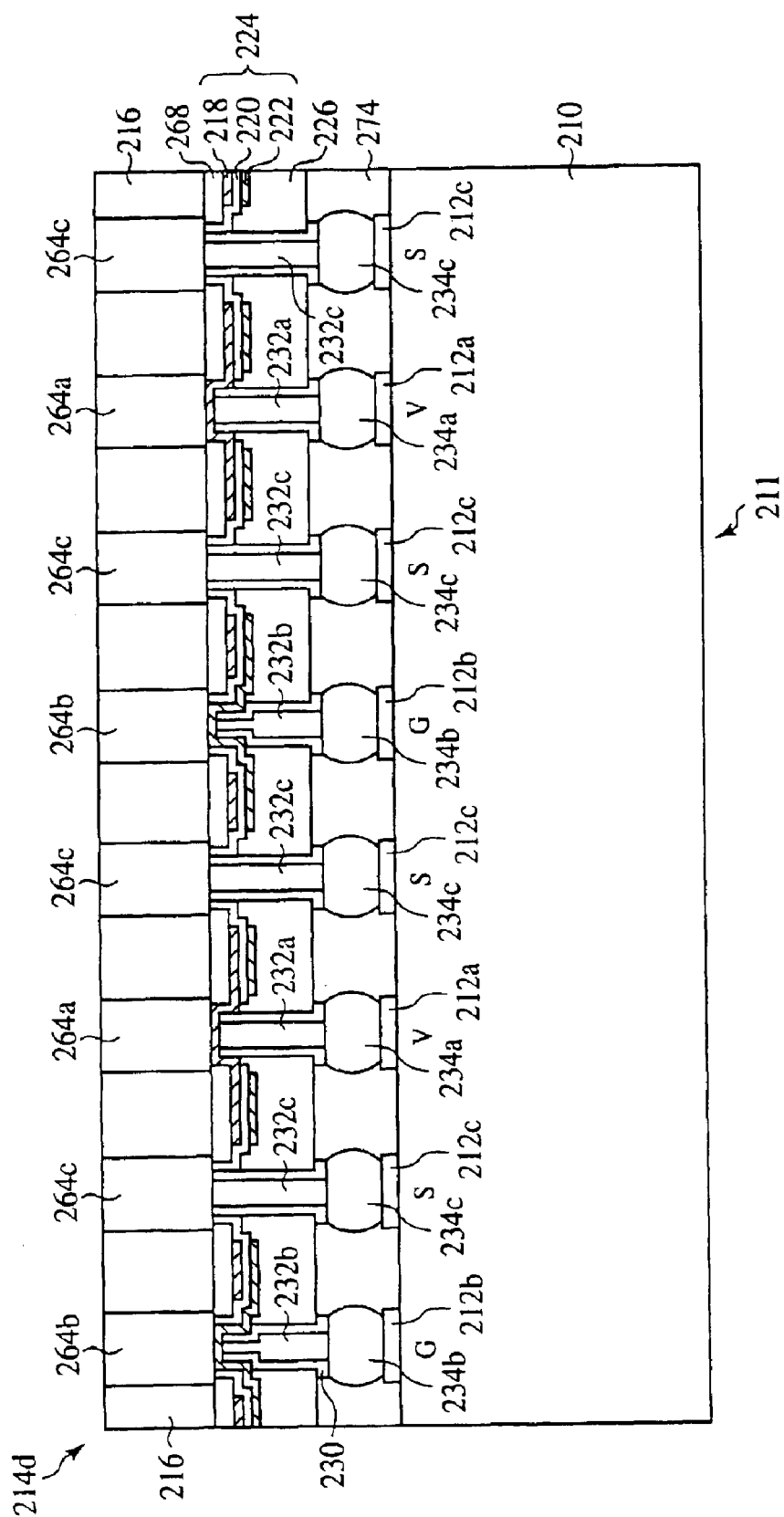
FIG. 30 is sectional views of the semiconductor device according to the eighth embodiment of the present invention in the steps of the method for fabricating the semiconductor device, which explain the method (Part 1).
Figure 31:
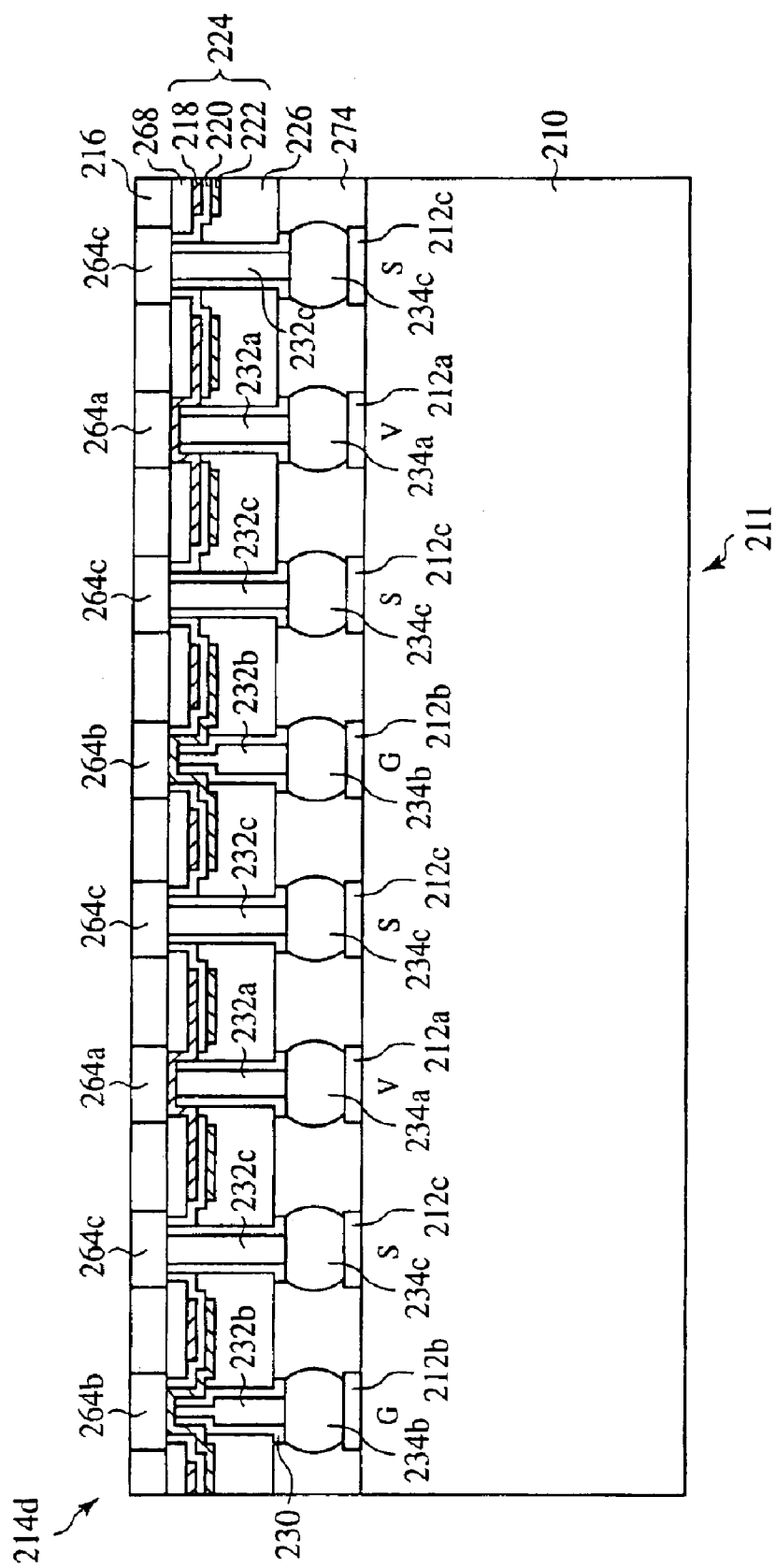
FIG. 31 is sectional views of the semiconductor device according to the eighth embodiment of the present invention in the steps of the method for fabricating the semiconductor device, which explain the method (Part 2).
Figure 32:
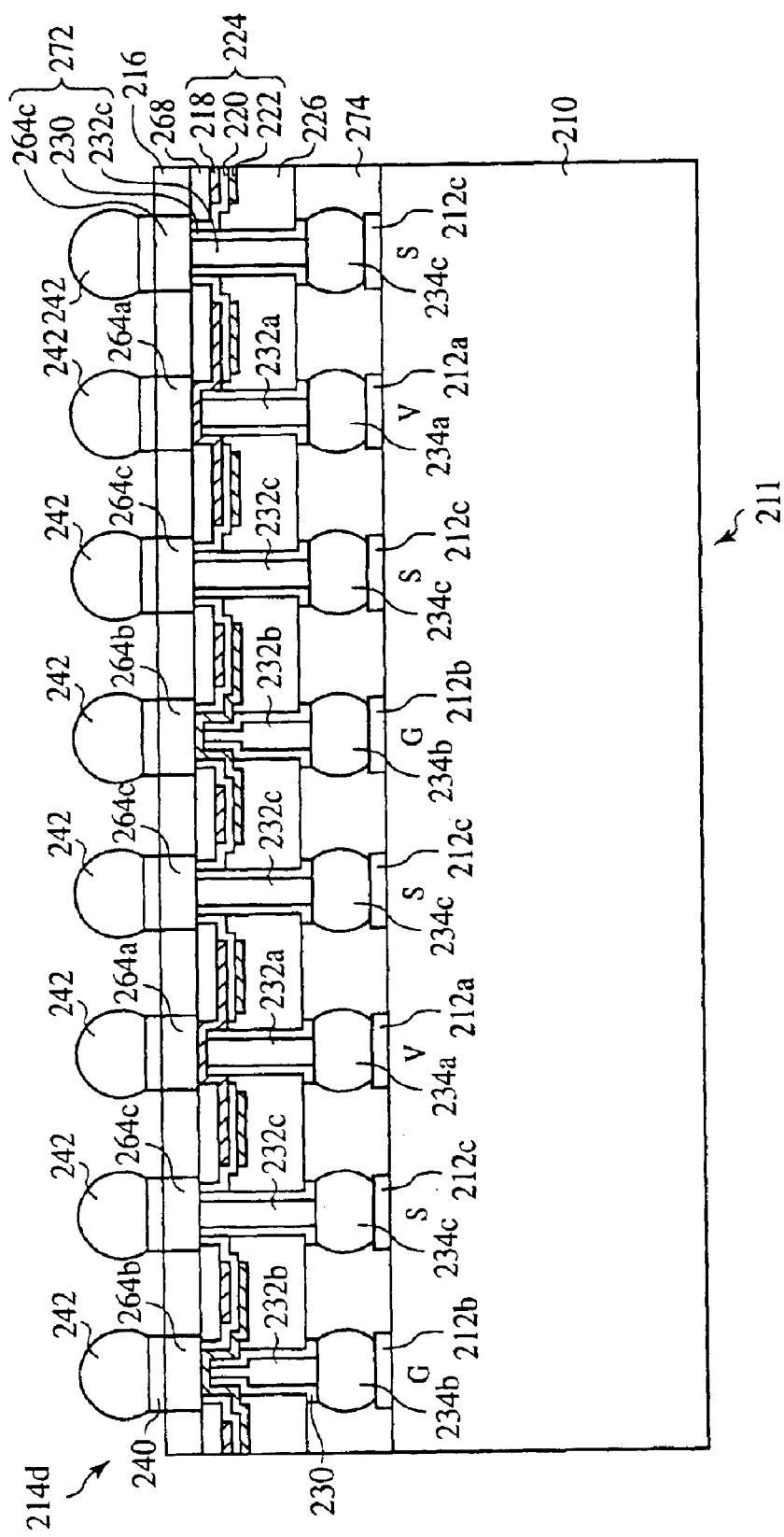
FIG. 32 is sectional views of the semiconductor device according to the eighth embodiment of the present invention in the steps of the method for fabricating the semiconductor device, which explain the method (Part 3).

The semiconductor device according to an eighth embodiment of the present invention and the method for fabricating the semiconductor device will be explained with reference to FIGS. 29 to 32. FIG. 29 is a sectional view of the semiconductor device according to the present embodiment. FIGS. 30 to 32 are sectional views of the semiconductor device according to the present embodiment in the steps of the method for fabricating the semiconductor device, which explain the method. The same members of the present embodiment as those of the semiconductor device according to the first to the seventh embodiments and the method for fabricating the semiconductor device, etc. shown in FIGS. 1 to 7 are represented by the same reference numbers not to repeat or to simplify their explanation.

(Semiconductor Device)

First, the semiconductor device according to the present embodiment will be explained with reference to FIG. 29.

The semiconductor device according to the present embodiment is characterized mainly in that a capacitor 214d is formed on the entire upper surface of an LSI 211.

As shown in FIG. 29, the capacitor 214d is flip chip-bonded to electrodes 212a to 212c. The capacitor 214d is formed on the entire surface of the LSI 211.

An insulation film 274 of a resin is formed between the LSI 211 and the capacitor 214d.

The upper side of the capacitor 214d, i.e., the upper side of a silicon substrate 216 is polished.

Signal (S) lines (not shown) of the LSI 211 can be connected to a circuit wiring substrate (not shown) through the electrode 212c, solder bumps 234c, through-electrodes 272 and solder bumps 242.

Thus, according to the present embodiment, the capacitor 214d is formed on the entire surface of the LSI 211, whereby very large capacitance can be provided.

According to the present embodiment, the signal (S) lines of the LSI 211 can be connected to the circuit wiring substrate through the through-electrodes 272, which makes it unnecessary to form the vias 236 (see FIG. 17) separately from the capacitor. Consequently, according to the present embodiment, the semiconductor fabrication steps can be simplified, which contributes to lower costs.

Furthermore, according to the present embodiment, the upper side of the capacitor 214d is polished, which permits the semiconductor device to meet the requirements of downsizing and higher density.

(Method for Fabricating the Semiconductor Device)

Then, the method for fabricating the semiconductor device according to the present embodiment will be explained with reference to FIGS. 30 to 32.

First, as shown in FIG. 30, the capacitor 214d is flip chip-bonded to the electrodes 212a to 212c.

Then, a resin is loaded between a semiconductor wafer 210 and the capacitor 214d. The insulation film 274 is thus formed of the resin between the semiconductor wafer 210 and the capacitor 214d.

Then, as shown in FIG. 31, the upper side of the capacitor 214d is polished by CMP.

Next, as shown in FIG. 32, electrodes 240 are formed on the vias 264a to 264c.

Then, solder bumps 242 are formed on the electrodes 240.

Then, the semiconductor wafer 210 is diced in a chip size.

The semiconductor device according to the present embodiment is thus fabricated.

(Modification)

Figure 33:
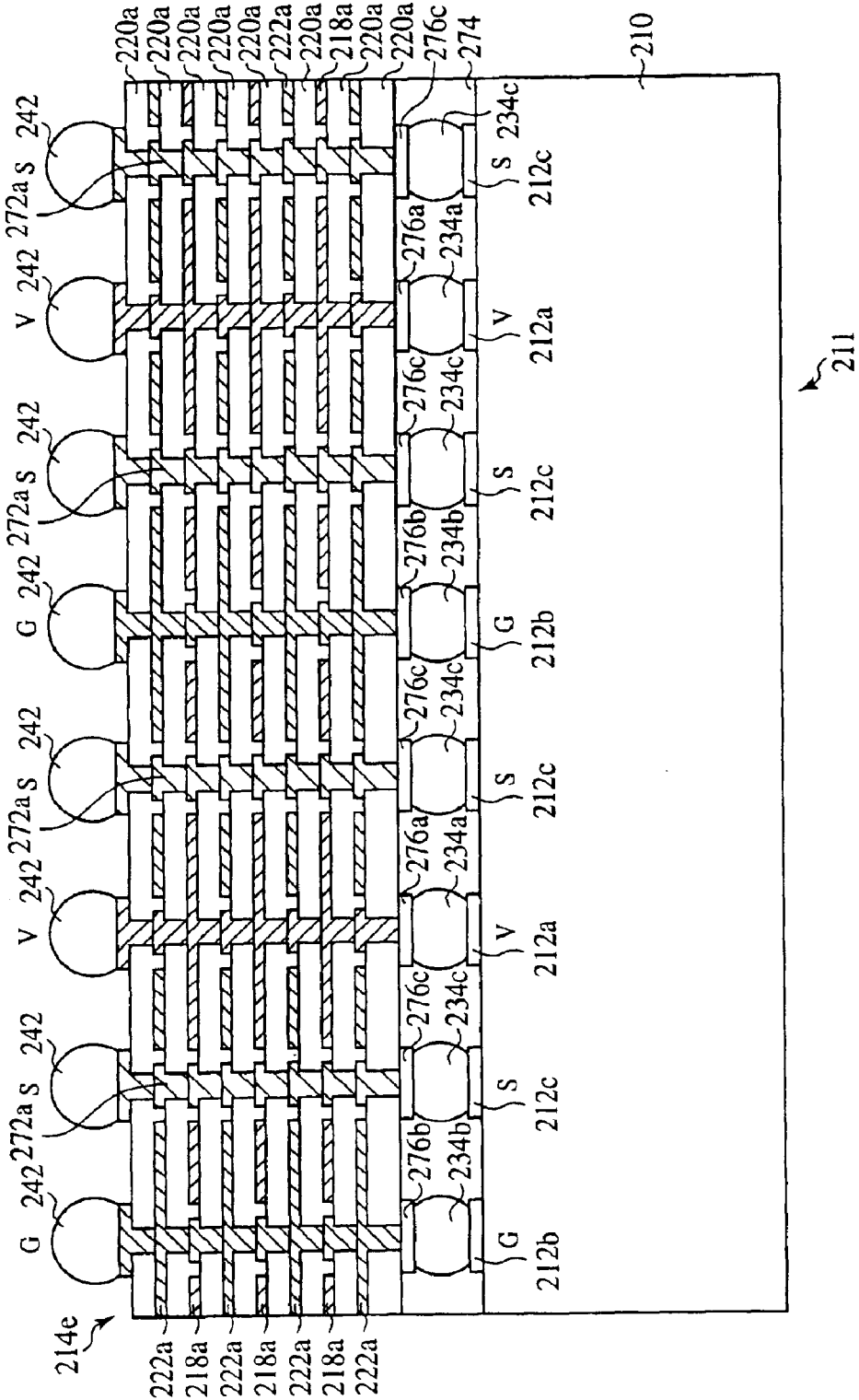
FIG. 33 is a sectional view of the semiconductor device according to a modification of the eighth embodiment of the present invention.

The semiconductor device according to a modification of the present invention will be explained with reference to FIG. 33. FIG. 33 is a sectional view of the semiconductor device according to the present modification.

The semiconductor device according to the present modification is characterized mainly by a capacitor 214e which is a thick-film ceramic capacitor.

As shown in FIG. 33, the capacitor 214e is formed of a 18 µm-thickness Ni film patterned in a prescribed configuration and a 100 µm-thickness BST film patterned in a prescribed pattern which are alternately laid on each other.

The electrodes 218a of the laid Ni films are electrically connected to electric power source (V) lines via the electrode 276a, solder bumps 234a and electrodes 212a. The electrodes 218a can be connected to electric power source (V) lines of a circuit wiring substrate (not shown) via solder bumps 242.

The electrodes 222a of the laid Ni films are electrically connected to ground (G) lines of the LSI 211 via electrodes 276b, solder bumps 234b and electrodes 212b. The electrodes 222a can be connected to ground (G) lines of the circuit wiring substrate via solder bumps 242.

Through-electrodes 272a formed of the laid Ni films are electrically connected to signal (S) lines of the LSI 211 via electrodes 276c, solder bumps 234c and electrodes 212c. The through-electrodes 272a can be connected to signal (S) lines of the circuit wiring substrate via solder bumps 242.

In the semiconductor device according to the present modification, a total thickness of the capacitor 214e is several hundred micrometer, and cannot satisfy the requirement of down-sizing but can ensure large capacitance because of the electrodes 218a, 222a and the dielectric film 220a which are laid alternately on each other.

A Ninth Embodiment

Figure 34:
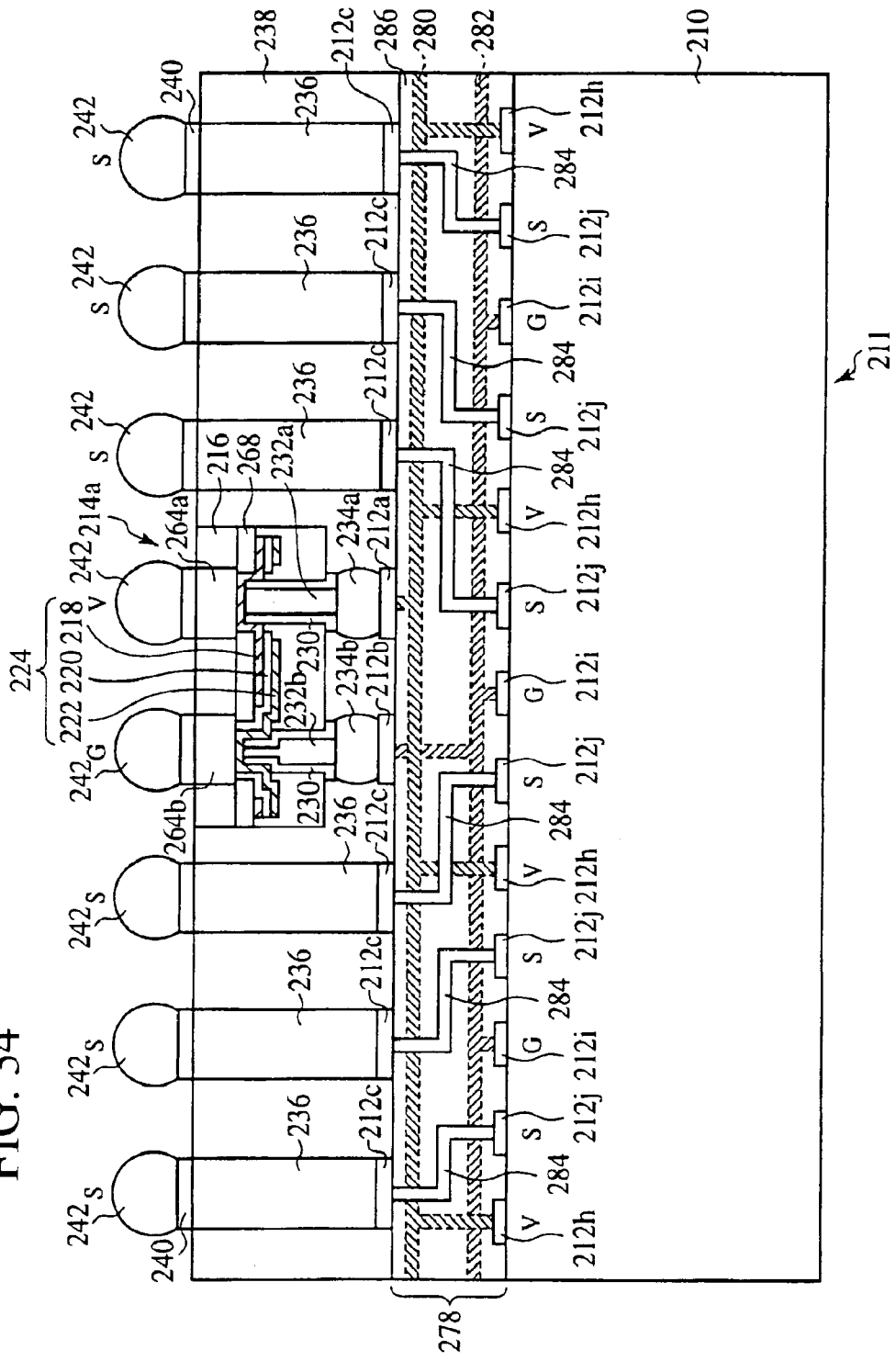
FIG. 34 is a sectional view of the semiconductor device according to a ninth embodiment of the present invention.

The semiconductor device according to a ninth embodiment of the present invention will be explained with reference to FIG. 34. FIG. 34 is a sectional view of the semiconductor device according to the present embodiment. The same members of the present embodiment as those of the semiconductor device according to the first to the eighth embodiments and the method for fabricating the semiconductor device, etc. shown in FIGS. 1 to 33 are represented by the same reference numbers not to repeat or to simplify their explanation.

The semiconductor device according to the present embodiment is characterized mainly in that a wiring layer 278 is formed on the upper surface of an LSI 211a.

As shown in FIG. 34, electrodes 212h to 212j are formed of Au on the upper surface of a semiconductor substrate 210 at a pitch of, e.g., 150 $\mu$m. The electrode 212h are electrically connected to electric power source (V) lines of the LSI 211a. The electrodes 212i are electrically connected to ground (G) lines of the LSI 211a. The power sources 212j are electrically connected to signal (S) lines (not shown) of the LSI 211a.

The wiring layer 278 is formed on the upper surface of the LSI 211a. In the wiring layer 278, electric power source lines 280, ground lines 282 and signal lines 284 are formed of Cu. Cu is used as a material of the electric power source lines 280, the ground lines 282 and the signal lines 284 because Cu, whose resistance is low, is effective to operate in a high frequency region.

The electric power source lines 280, the ground lines 282 and the signal lines 284 are insulated from one another by an inter-layer insulation film 286 of polyimide.

Electrodes 212a to 212c are formed of Au on the wiring layer 278 at a pitch of, e.g., 200 $\mu$m.

The electrodes 212h are electrically interconnected to each other by the electric power source lines 280 and electrically connected to the electrodes 212a through the electric power source lines 280.

The electrodes 212i are electrically interconnected to each other by the ground lines 282 and electrically connected to the electrodes 212b through the ground lines 282.

The electrodes 212j are connected to the electrodes 212c via the respective signal lines 28.

As described above, the present embodiment, in which the wiring layer 278 is formed on the upper side of the LSI 211a, is applicable to a case that a pitch of the electrodes of the circuit wiring substrate is different from that of the electrodes 212h to 212j of the LSI 211a, and also to a case that a layout of the electrode of the circuit wiring substrate is different from that of the electrodes 212h to 212j of the LSI 211a.

(Modification)

Then, the semiconductor device according to a modification of the semiconductor device according to the present embodiment will be explained with reference to FIG. 35.

Figure 35:
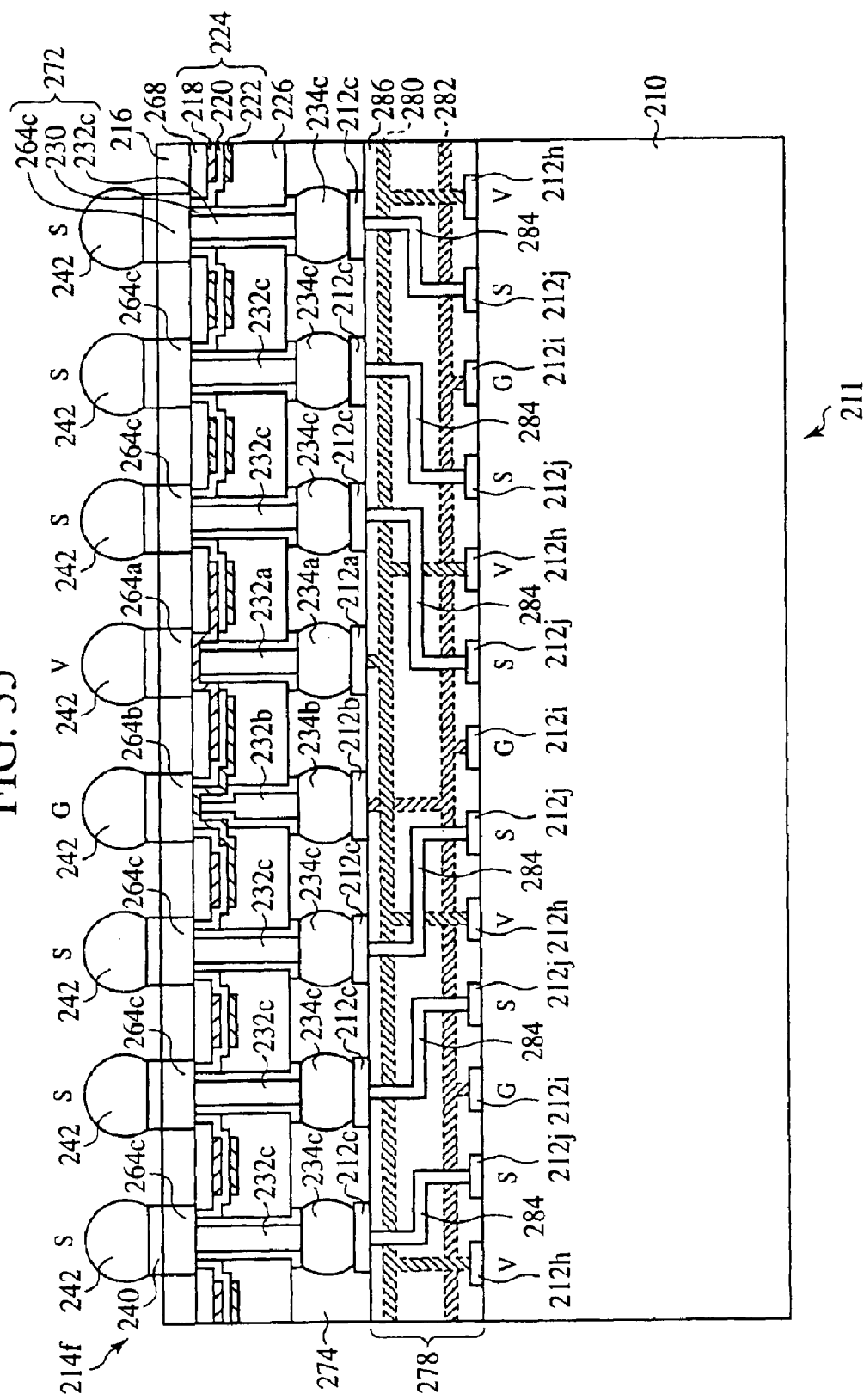
FIG. 35 is a sectional view of the semiconductor device according to a modification of the ninth embodiment of the present invention.

FIG. 35 is a sectional view of the semiconductor device according to the modification.

The semiconductor device according to the present modification is characterized mainly in that a capacitor 214f is formed on the entire surface.

According to the present modification, the capacitor 214f is formed on the entire upper surface of an LSI 211a, whereby large capacitance can be provided.

According to the present modification, signal (S) lines of the LSI 211a can be connected to a circuit wiring substrate via through-electrodes 272, which makes it unnecessary to form the vias 236 (see FIG. 17) separate from the capacitor 214f. Consequently, according to the present modification, the semiconductor fabrication steps can be simplified, which contributes to lower costs.

Modified Embodiments

The present invention is not limited to the above-described embodiments and can cover other various modifications.

For example, in the above-described embodiments, a material of the dielectric film is BST, but a material of the dielectric film is not limited to BST and can be any dielectric. For example, as a material of the dielectric film, a composite oxide containing at least one element of Sr, Ba, Pb, Zr, Bi, Ta, Ti, Mg and Nb. Specifically, for example, PZT $(Pb(Zr,Ti)O_3)$, $SrBi_2Ta_2O_9$, $Pb(Mg,Nb)O_3$, $Ta_2O_5$, or others can be used as a material of the dielectric film. A composition of the PZT can be, e.g., $PbZr_{0.5}Ti_{0.5}O_3$. A composition of $Pb(Mg,Nb)O_3$ can be, e.g., $PbMg_{1/3}Nb_{2/3}O_3$. Silicon dioxide or others may be used as a material of the dielectric film.

The dielectric film of PZT can be formed by sputtering. Film forming conditions for forming the PZT film by sputtering can be, e.g., 36 sccm Ar gas flow rate, 4 sccm $O_2$ gas flow rate, 0.5 Pa vacuum degree, 120 W applied electric power and 10 hour-film forming time. By using these conditions, a 200 nm-thickness PZT film of a 500 specific dielectric constant can be formed. The PZT film is not essentially formed by sputtering and may be formed by, e.g., sol-gel process.

In the first to the fifth embodiments, a high dielectric material is used as a material of the dielectric film, but a material of the dielectric film is not essentially limited to high dielectrics. For example, silicon dioxide or others may be used as a material of the dielectric film.

In the first to the fifth embodiment, a thickness of the dielectric film is 200 nm, but a thickness of the dielectric film is not limited to 200 nm. A thickness of the dielectric film may be suitably set so that required characteristics can be obtained.

Dielectric films and conducting films may be formed further on the conducting film 34 of the capacitor according to the first or the second embodiment, on the conducting film 66 of the capacitor according to the third embodiment, on the conducting film 34a of the capacitor according to the fourth embodiment or on the conducting film 34b of the capacitor according to the fifth embodiment to thereby form capacitors of larger capacitances.

In the first to the fifth embodiments, a material of the conducting films forming the first electrodes and the second electrodes is Pt, but a material of these conducting films is not limited to Pt. For example, Au, Cu, Pd, Ru, Ru oxide, Ir, Ir oxide or others may be used. Materials of the first and the second electrodes of the capacitors are suitably set to thereby improve leak current characteristics, etc. of the capacitors.

In the above-described embodiments, materials of the insulation films 28, 28a, etc. are polyimide, silicon dioxide. Materials of the insulation films 28, 28a are not limited to polyimide and silicon dioxide. Materials whose voltage resistance is higher than that of a material of dielectric film may be suitably used.

In the above-described embodiments, a material of the insulation film 28a, etc. is silicon dioxide. A material of the insulation film 28a, etc. is not limited to silicon dioxide. Any other material can be suitably used as long as the material can resist high temperature heat treatments. Such materials are, e.g., inorganic substances, such as $Al_2O_3$, $Si_3N_4$ or others. Generally, in comparison with organic materials, inorganic substances can resist high temperature heat treatments.

In the above-described embodiments, as materials of the insulation films 28, 28a, etc., materials having higher voltage resistance than a material of the dielectric film are used, but materials of the insulation films 28, 28a may not be essentially materials having higher voltage resistance than a material of the dielectric film. That is, the insulation films may be formed of any material as along as the material can increase an effective insulation film thickness in the region near the edge of the conducting film.

In the above-described embodiment, materials of the insulation films 28, 28a, etc. are polyimide, silicon dioxide. Materials of the insulation films may be high dielectrics. The insulation films 28, 28a, etc. formed of high dielectrics can function as dielectrics of the capacitors, whereby the capacitors can have larger capacitances. For example, as materials of the insulation films 28, 28a, etc. composite oxides containing at least one element of Sr, Ba, Pb, Zr, Bi, Ta, Ti, Mg and Nb can be used. Specifically, for example, BST, PZT, $SrBi_2Ta_2O_9$, $Pb(Mg,Nb)O_3$, $Ta_2O_5$ or others may be used as materials of the insulation films 28, 28a, etc.

In the above-described embodiments, the insulation films 28, 28a, etc. are formed, whereby an effective thickness of the insulation film between the conducting film forming the first electrode of the capacitor and the conducting film forming the second electrode of the capacitor is increased in the region near the edge of the conducting film. However, as long as an effective insulation film thickness in the region near the edge of the conducting film can be increased, the insulation films may not be formed separately from the dielectric film.

In the above-described embodiments, a thickness of the insulation films 28, 28a, etc. are 20 nm. However, a thickness of the insulation films 28, 28a, etc. is not limited to 200 nm and can be suitably set so that the capacitors can provide required characteristics.

In the above-described embodiments, silicon substrates are used, but the substrates are not essentially silicon substrates. For example, glass substrates, etc. may be used.

In the above-described embodiments, the temporary seal layers 252, 260 are formed of polyimide resin, but a material of the temporary seal layer is not limited to polyimide resin, and other materials may be used. For example, PES (PolyEther Sulfide) dissolved with NMP(N-methyl-2-pyrolidone) is applied to the entire surface and dried to form the temporary seal layers. The seal layers thus formed can be removed by using NMP.

In the above-described embodiments, the Cu layer 258 is formed after a height of the Cu layer 250 has been evened. However, the Cu layer 258 may be formed on the Cu layer 250 without evening the height of the Cu layer 250, whereby the steps can be simplified.

In the above-described embodiments, two layers, the Cu layers 250, 258 are formed to form the vias 236. More Cu layers are laid to form vias so as to form vias of a required height.

In the above-described embodiments, the Cu layers are laid by plating to form the vias 236, but the vias 236 may be formed by any other process.

In the above-described embodiments, the bonding is made by means of solder bumps, but the bonding with solder bumps is not essential. Any other bonding method can be suitably used. For example, press bonding may be used, or conducting adhesives may be used.

In the seventh embodiment; the electrodes 218, 222 are connected to the electric power source (V) lines and the ground (G) lines of circuit wiring substrates through the vias 264a, 264b. However, without forming the vias 264a, 264b, the electrodes 218, 222 may be connected to the electric power source (V) lines and the ground (G) lines of the circuit wiring substrate.

In the above-described embodiments, the electrodes 218, 222 of the capacitors are formed of Pt and Au. However, materials of the electrodes 218, 222 are not limited to Pt and Au. For example, Ni, Cu, Pd, Ru, Ru oxide, Ir, Ir oxide, etc. may be suitably used.

In the ninth embodiment, the electric power source lines 280, the ground lines 282 and the signal lines 284 are formed of Cu, but a materials of them is not limited to Cu. Other low resistance materials, such as Au, Ag, Al, etc., may be suitably used.

In the above-described embodiments, capacitors are mounted. However, capacitors are not essential, and passive components, such as resistor, inductors, etc., may be mounted on. Capacitors, resistors, inductors, etc. may be mounted together.

Capacitors to be mounted on the semiconductor device according to the sixth to the ninth embodiments may be the capacitor according to the first to the fifth embodiments.

What is claimed is:

1. A semiconductor device comprising:
   a semiconductor element substrate;
   a passive component mounted on the semiconductor element substrate and electrically connected to electrodes of the semiconductor element substrate;
   column-shaped conductors formed over the semiconductor element substrate in a region other than a region where the passive component is mounted, and having a height which is substantially flush with at least the upper surface of the passive component, and
   an insulation layer burying the passive component and the column-shaped conductors,
   the upper surfaces of the column-shaped conductors being exposed on the surface of the insulation film.

2. A semiconductor device comprising:
   a semiconductor element substrate;
   a passive component mounted on the semiconductor element substrate and electrically connected to electrodes of the semiconductor element substrate;
   column-shaped conductors formed over the semiconductor element substrate in a region other than a region where the passive component is mounted; and
   an insulation layer burying the passive component and the column-shaped conductors,
   the semiconductor element substrate being electrically connected to an outside terminal via the column-shaped conductors.

3. A semiconductor device according to claim 1 wherein
the passive component includes a passive element formed on a side of a support substrate opposed to the semiconductor element substrate, and
the passive component includes electrodes electrically connected to the passive element and exposed on the side of the upper side of the support substrate.

4. A semiconductor device according to claim 3, wherein
the electrodes exposed on the side of the upper surface of the support substrate are electrically connected to the passive element through the support substrate.

5. A semiconductor device according to claim 1, wherein
a pitch of a plurality of the electrodes of the semiconductor element substrate is smaller than a pitch of a plurality of the column-shaped conductors.

6. A semiconductor device according to claim 3, wherein
the passive component further comprises through-electrodes insulated from the passive element and electrically connected to the semiconductor element substrate through the passive component.

7. A semiconductor device according to claim 1, wherein
the upper surface of the passive component is covered with the insulation layer.

8. A semiconductor device according to claim 6, further comprising:
a wiring layer formed on the semiconductor element substrate and having relay wiring,
the passive element, the column-shaped conductors or the through-electrodes are electrically connected to the semiconductor element substrate via the relay wiring.

9. A semiconductor device according to claim 1, wherein
the passive component is flip chip-bonded to the electrodes of the semiconductor element substrate or the electrodes formed on the wiring layer.

10. A semiconductor device according to claim 1, wherein the passive component is a capacitor, a resistor, or an inductor.

* * * * *

UNITED STATES PATENT AND TRADEMARK OFFICE
CERTIFICATE OF CORRECTION

PATENT NO.     : 6,873,038 B2
DATED          : March 29, 2005
INVENTOR(S)    : Takeshi Shioga et al.

It is certified that error appears in the above-identified patent and that said Letters Patent is hereby corrected as shown below:

Title page,
Item [57], ABSTRACT,
Lines 10 and 13, replace "conducing" with -- conducting --.

Signed and Sealed this

Twenty-seventh Day of December, 2005

JON W. DUDAS
*Director of the United States Patent and Trademark Office*